(12) United States Patent
Dammel et al.

(10) Patent No.: US 7,351,521 B2
(45) Date of Patent: Apr. 1, 2008

(54) PHOTORESIST COMPOSITION FOR DEEP ULTRAVIOLET LITHOGRAPHY

(75) Inventors: Ralph R. Dammel, Flemington, NJ (US); Raj Sakamuri, Sharon, MA (US); Francis M. Houlihan, Millington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 11/716,361

(22) Filed: Mar. 9, 2007

(65) Prior Publication Data

US 2007/0154841 A1 Jul. 5, 2007

Related U.S. Application Data

(60) Division of application No. 10/658,840, filed on Sep. 9, 2003, now Pat. No. 7,211,366, which is a continuation-in-part of application No. 10/371,262, filed on Feb. 21, 2003, now abandoned.

(51) Int. Cl.
  *G03F 7/30* (2006.01)
  *G03F 7/021* (2006.01)

(52) U.S. Cl. .................. 430/326; 430/171; 430/330

(58) Field of Classification Search ................ 430/326, 430/170, 270.1, 330, 907
See application file for complete search history.

(56) References Cited

U.S. PATENT DOCUMENTS 6,136,499 A * 10/2000 Goodall et al. .......... 430/270.1
6,468,712 B1 * 10/2002 Fedynyshyn ............. 430/270.1
6,727,032 B1 * 4/2004 Suwa et al. ................. 430/170
6,790,587 B1 * 9/2004 Feiring et al. ........... 430/270.1
6,800,414 B2 * 10/2004 Nishimura et al. ...... 430/270.1
6,849,377 B2 * 2/2005 Feiring et al. ........... 430/270.1
6,908,724 B2 * 6/2005 Araki et al. ............. 430/270.1

* cited by examiner

*Primary Examiner*—John S. Chu
(74) *Attorney, Agent, or Firm*—Sangya Jain

(57) ABSTRACT

The present invention relates to a photoresist composition comprising a photoacid generator and at least one polymer comprising at least one unit as described by structure 1,

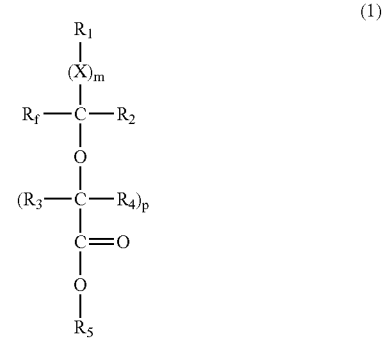

(1)

The invention also relates to a process for imaging the photoresist composition of the present invention, and to a process of making the polymer in the presence of an organic base.

19 Claims, 6 Drawing Sheets

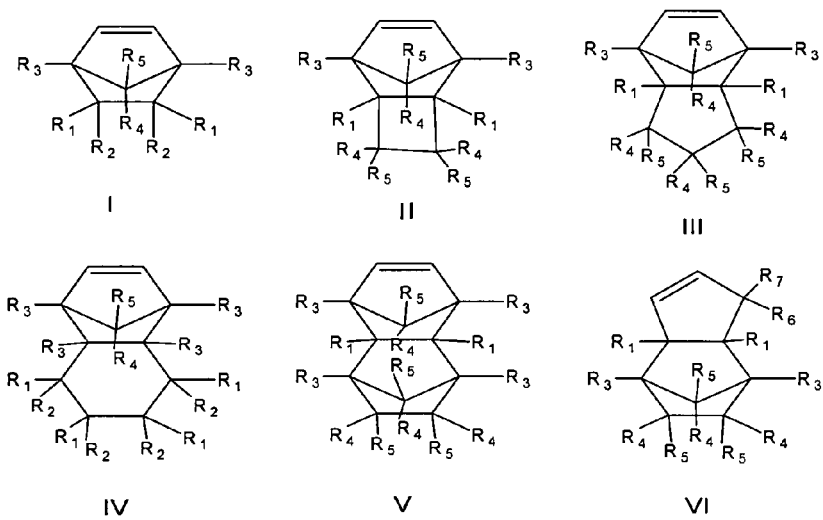
where, in Figure 1, $R_1$-$R_7$ are independently H, F, (C1-C8)alkyl, (C1-C8)fluoroalkyl, etc but at least one of $R_1$-$R_6$ has the pendant oxyAOCA functionality described in structure 1, or an alcohol functionality which can be capped to give the unit of structure 1.
Figure 1: Generic structures for the norbornene-based monomer

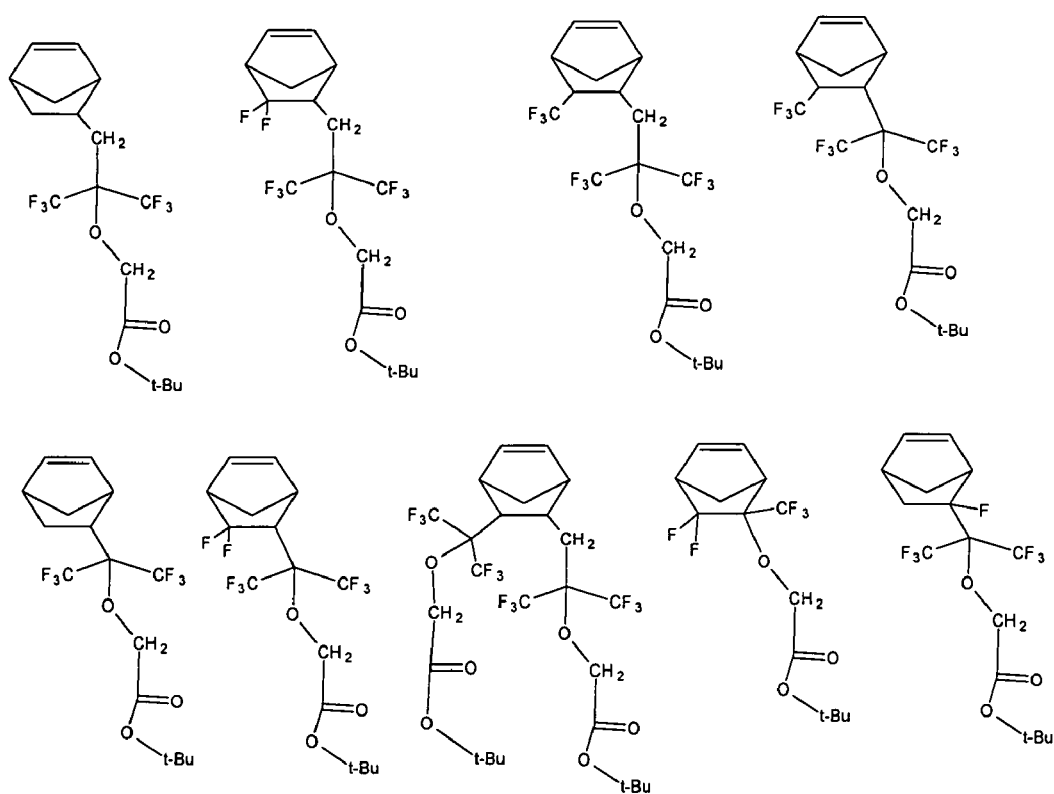
Figure 2: Examples of BOCME protected norbornene monomers

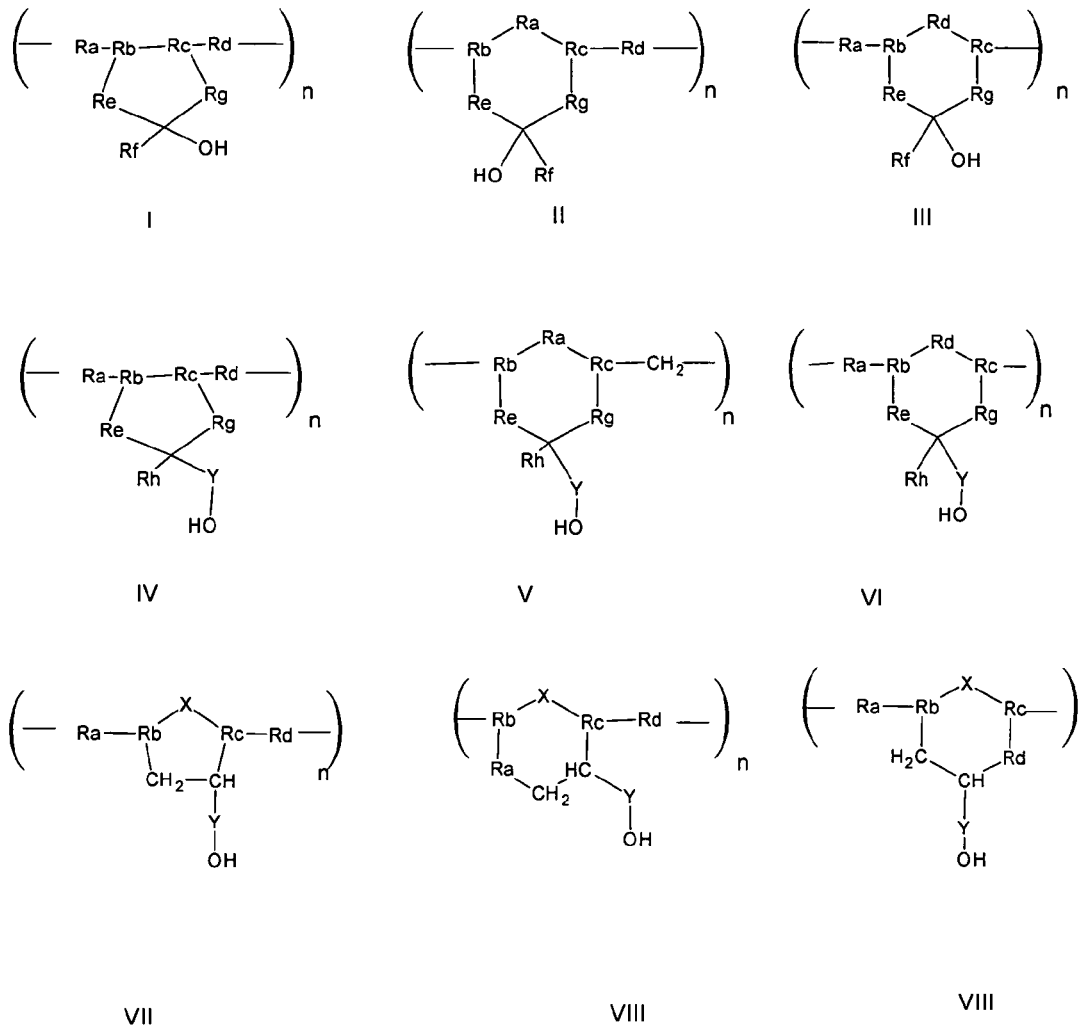
Figure 3: Generic monocyclic polymers having pendant hydroxy groups

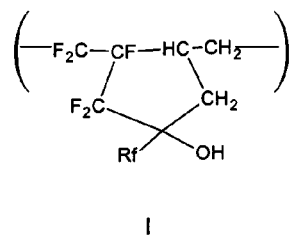
I
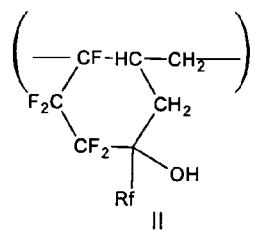
II
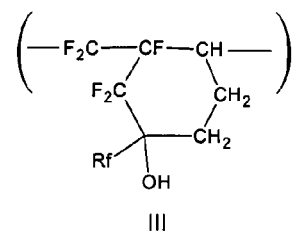
III
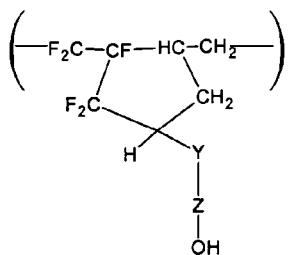
IV
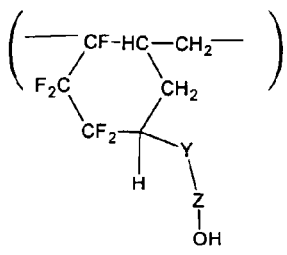
V
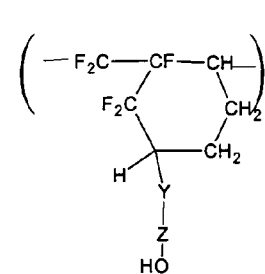
VI
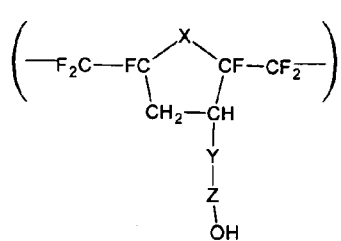
VII
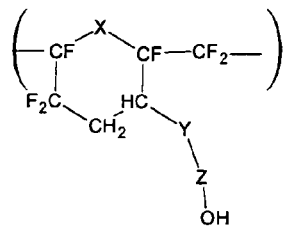
VIII
Rf = fluoroalkyl group C1-C8
Z= $CF_2$, $C(C_nF_{2n+1})_2$, $C(C_nF_{2n+1})(C_nH_{2n+1})$,
n=1-12
Y= alkyl or fluoroalkyl spacer group C0-C8
X= $CF_2$, O
Figure 4: Partially fluorinated monocyclic polymers having pendant alcohol groups

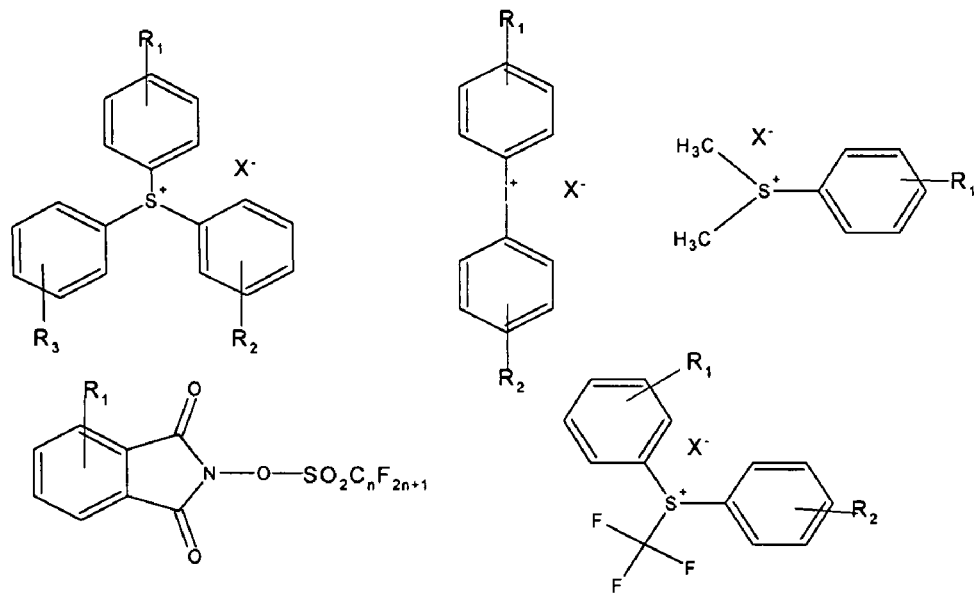
$R_1$, $R_2$, $R_3$ are independently alkyl, fluoroalkyl, F, $OC_nH_{2n+1}$, $OC_nF_{2n+1}$, $CO_2$-tert-Bu, $OCH_2$-$CO_2$-tert-Bu n=1-4, $OCH_2OCH_3$
$X^-$ =Anion of non-nucleophlic strong acid eg $^-OSO_2C_nF_{2n+1}$; $AsF_6^-$, $SbF_6^-$, $^-N(SO_2C_nF_{2n+1})_2$; $^-C(SO_2C_nF_{2n+1})_3$
Figure 5: Examples of Photoactive Compounds
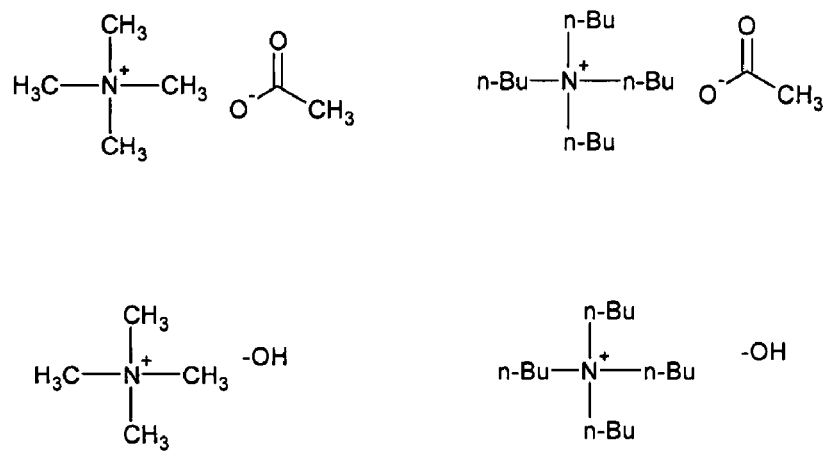
Figure 6: Examples of suitable ammonium bases

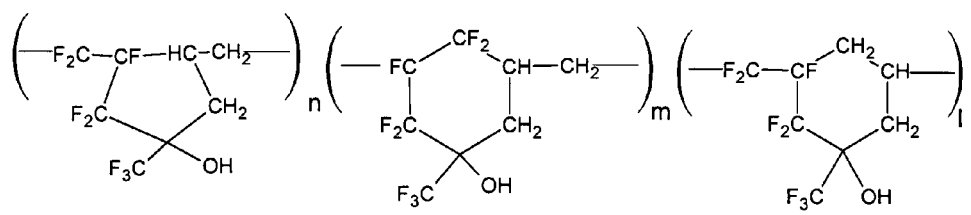
Figure 7: PPTHH poly(1,1,2,3,3-pentafluoro-4-trifluoromethyl-4, hydroxyl-1,6-heptadience) which is a mixture of 5 and 6 membered rings
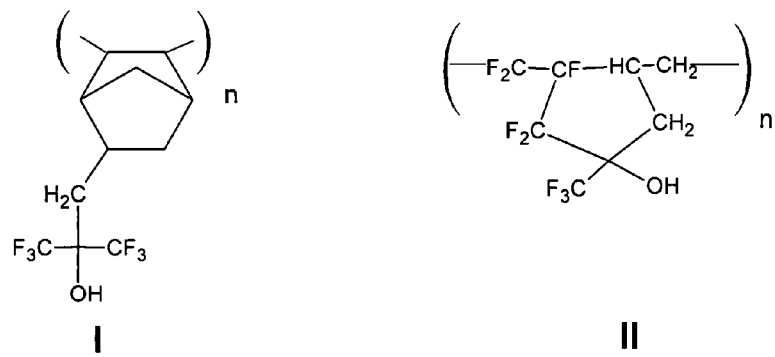
I                II
Figure 8: Fluoroacohol polymers made from polymerization of either alicyclic moieties (I) or fluorinated dienes (II).

PHOTORESIST COMPOSITION FOR DEEP ULTRAVIOLET LITHOGRAPHY

This application is a division of application Ser. No. 10/658,840, filed Sep. 9, 2003 now U.S. Pat. No. 7,211,366, which is a continuation-in-part of application Ser. No. 10/371,262, filed Feb. 21, 2003 now abandoned, the contents of which are herein incorporated by reference.

FIELD OF THE INVENTION

The present invention relates to a novel photoresist composition that is particularly useful in the field of microlithography, and especially useful for imaging positive patterns in the production of semiconductor devices. The photoresist resin composition comprises a polymer or a mixture of polymers in which fluoro-alcohol moieties on an aliphatic cyclic fluorinated polymer are fully or partially protected with an alkyloxycarbonylalkyl (AOCA) protecting group, a photoactive component, and optionally, a base additive. The resin of the novel photoresist has high transparency in the deep ultraviolet (uv) region, and such a composition is especially useful for exposure at 193 nanometers (nm) and 157 nm. The invention further relates to a process for imaging the novel photoresist. The invention also relates to a process for making the polymer of the present invention.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive at lower and lower wavelengths of radiation and has also led to the use of sophisticated multilevel systems to overcome difficulties associated with such miniaturization.

The present photoresist compositions are positive-working photoresist, i.e. when they are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the formation of a positive image in the photoresist coating. Again, a desired portion of the underlying surface is uncovered.

Photoresist resolution is defined as the smallest feature which the resist composition can transfer from the photomask to the substrate with a high degree of image edge acuity after exposure and development. In many leading edge manufacturing applications today, photoresist resolution on the order of less than 100 nm are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm are often used where subhalfmicron geometries are required. Particularly preferred are photoresists comprising non-aromatic polymers, a photoacid generator, optionally a dissolution inhibitor, and solvent.

High resolution, chemically amplified, deep ultraviolet (100-300 nm) positive and negative tone photoresists are available for patterning images with less than quarter micron geometries. To date, there are three major deep ultraviolet (uv) exposure technologies that have provided significant advancement in miniaturization, and these use lasers that emit radiation at 248 nm, 193 nm and 157 nm. Photoresists for 248 nm have typically been based on substituted polyhydroxystyrene and its copolymers, such as those described in U.S. Pat. No. 4,491,628 and U.S. Pat. No. 5,350,660. On the other hand, photoresists for exposure below 200 nm require non-aromatic polymers since aromatics are opaque at this wavelength. U.S. Pat. No. 5,843,624 and GB 2320718 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers, but the presence of maleic anhydride makes these polymers insufficiently transparent at 157 nm.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (Hoang V. Tran et al Macromolecules 35, 6539, 2002, WO 00/67072, WO 00/17712) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p 76 2002; WO 02/065212) or copolymerization of a fluorodiene with an olefin (WO 01/98834-A1). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type.

However, an important limitation to any of these approaches is the availability of a suitable protecting group for fluoroalcohols. In almost all of these approaches, the acid labile protecting groups for the fluoroalcohol moiety has been mainly limited in scope to either acetal type (e.g. MOM (methoxymethyl), or tertiaryalkoxycarbonyl (eg. t-BOC (tert-butyloxycarbonyl) or tertiary alkyl protecting groups. These protecting groups on the perfluoroalcohol moiety are relatively unstable and often undergo partial or complete deprotection during polymerization.

The difficulty in protecting the fluoroalcohol functionality, and the resultant loss of the unexposed photoresist film, has meant that the acid labile functionality can often only be attached to either a methacrylate, acrylate, or norbornenecarboxylic acid repeat unit (which are deleterious to transparency at 157 nm) or to a dissolution inhibitor additive (WO 00/67072, WO 00/17712 Hoang V. Tran et al Macromolecules 35, 6539, 2002). The objective of this invention is to provide a protecting group which would confer good transparency at 157 nm, and would possess high thermal stability towards both synthetic and photoresist processing conditions.

The inventors of this application have found that, surprisingly, aliphatic cyclic polymers can have their fluoroalcohol moieties easily functionalized with an alkyloxycarbonylalkyl(AOCA) group and that this group provides these types of resins with surprising advantages for photoresist applications.

The AOCA group, particularly the tert-butoxycarbonylmethyl (BOCME) group, has had some prior use as a substituent in pharmaceutical applications (WO9533753, DE 2460537). It has also been employed in resist applications where the BOCME group is attached to a phenolic moiety in a resin or as small molecule dissolution inhibitor, and used with radiation at i-line (JP 09211865), 248 nm (JP 20011312065, U.S. Pat. No. 6333436B1, U.S. Pat. No. 6,369,276, JP 08193055) or electron beam and X-ray(JP 2000-376059). In addition, at 248 nm, it has also been employed to protect phenolic resins (JP 08176051). Additionally, the BOCME group has been used to protect some specific monomers for 157 nm photoresists. US 2002/090572 A1 and US2002/0081520 A1 discuss the use of BOCME protected hexafluorobisphenol-A in silsesquioxane based polymers and copolymers, which, however, are very absorbent at 157 nm. Additionally, the use of the BOCME group to protect fluoroalcohol moieties attached to cyclic or alicyclic polymer repeating units are disclosed in WO 02/44811 A2 and EP 1,275,666. In WO 01/74916A1, the abstract discloses a polymer having one segment with an acid decomposable group, one segment derived from a fluoroacrylate and another segment derived from other copolymerizable monomer, and the patent application discloses a large variety of possible polymers. In WO 02/44811 A2, the BOCME group is used to protect a norbornenefluoroalcohol group, however, the polymer is used in a blend with a tetrafluoroethylene copolymer.

Fluorinated analogs of BOCME (e.g. —FC(CH$_3$)CO$_2$t-Bu) have been described as substituents for phenol moieties in applications such as herbicides (EP0044979). US 2002/0061466 discloses the functionalization of the fluorinated analogue of the BOCME group, but on an acrylate monomer.

The present inventors have found that when the AOCA group is used to protect fluoroalcohol moieties it is unexpectedly found to possess higher stability towards thermal cleavage than the t-BOC group or the MOM protecting group. Generally, from a photoresist standpoint, such an increase in thermal stability of the protected fluoroalcohol imparted by use of AOCA, particularly the BOCME group, is desirable as it increases thermal processing latitude and shelf life. Also, from a synthetic standpoint, such a increase in thermal stability is desirable as it helps to increase the yield of protected fluoroalcohol polymers, whether they are made by protection of pre-formed fluoroalcohol polymers or through polymerization of monomers containing a fluoroalcohol bearing polymer protected by AOCA groups. Surprisingly, despite its high thermal stability, the BOCME protecting group, in particular, can be easily removed by photoreleased acid in the exposed resist areas, requiring standard post-exposure bake temperatures to affect cleavage (110° C.-130° C.). It has also been found by the applicants that the functionalization of perfluoroalcohols with AOCA groups results in higher contrast photoresist systems than using tert-butyl carboxylates of photoresist resins containing norbornene-5-carboxylic acid repeat units.

The process of functionalizing the AOCA group to the polymer comprises reacting a polymer containing a hydroxyl group with a reactant that can provide the AOCA group and the reaction proceeds in the presence of a base. Typically, metal bases, especially alkali and alkaline-earth metals, have been used for this reaction, examples of such bases are, sodium hydride, lithium t-butoxide, potassium t-butoxide, etc. U.S. Pat. No. 6,210,859 discloses the reaction of polyhydroxystyrene with t-butyl bromoacetate and morpholino bromoacetate in the presence of 25% tetramethyl ammonium hydroxide aqueous solution.

The inventors of the present application have found that for the synthesis of the aliphatic polymer of the present invention, organic bases, especially ammonium bases, are advantageous over metal bases. Metals from metal bases are harder to remove from the final photoresist than organic bases, and metal bases can leave behind trace amounts of metals which are detrimental to the final product.

SUMMARY OF THE INVENTION

The present invention relates to a photoresist composition comprising a photoacid generator and at least one novel polymer comprising at least one unit as described by structure 1,

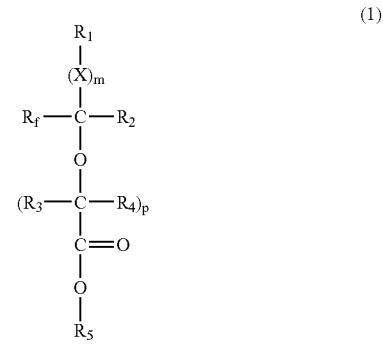

where, either (i) R$_1$ is an aliphatic cyclic unit of a polymer, R$_2$ is selected from H, F, (C$_1$-C$_8$)alkyl, (C$_1$-C$_8$)fluoroalkyl, cycloalkyl, cyclofluoroalkyl, and (CR$_3$R$_4$)p(CO)OR$_5$, and R$_f$ is selected from F, H, (C$_1$-C$_8$)alkyl, or a fully or partially fluorinated alkyl, and cyclofluoroalkyl, or (ii) $R_1$ and $R_2$ combine to form an aliphatic cyclic unit of a polymer, and $R_f$ is selected from F, H, ($C_1$-$C_8$)alkyl and a fully or partially fluorinated alkyl, and cyclofluoroalkyl, or (ii) $R_1$ and $R_f$ combine to form an aliphatic cyclic unit of a polymer, and $R_2$ is selected from H, F, ($C_1$-$C_8$)alkyl, ($C_1$-$C_8$)fluoroalkyl, cycloalkyl, cyclofluoroalkyl, and ($CR_3R_4$)p(CO)$OR_5$; and, $R_3$ and $R_4$ are independently H, F, ($C_1$-$C_8$)alkyl, ($C_1$-$C_8$)fluoroalkyl, cycloalkyl, cyclofluoroalkyl, ($CR_3R_4$)p(CO)$OR_5$, $R_3$ and $R_4$ may combine to form an alkylspirocyclic or a fluoroalkylspirocyclic group, X is selected from ($C_1$-$C_8$)alkylene, ($C_1$-$C_8$)fluoroalkylene, $O(C_1$-$C_8$)alkylene, $O(C_1$-$C_8$)fluoroalkylene, cycloalkyl and fluorinatedcycloalkyl, $R_5$ is H or an acid labile group, m=0-1, and p=1-4.

The invention also relates to a process for imaging the photoresist composition of the present invention, especially at 157 nm.

The invention further relates to a process for making the polymer of the present invention using organic bases, particularly ammonium bases.

BRIEF DESCRIPTION OF THE DRAWINGS

FIG. 1 illustrates the generic structure for the norbornene-based monomer.

FIG. 2 gives examples of BOCME protected nornornene monomers.

FIG. 3 shows generic monocyclic polymers having pendant hydroxy groups.

FIG. 4 illustrates partially fluorinated monocyclic polymers having pendant alcohol groups.

FIG. 5 gives examples of photoactive compounds which can be used in the photoresist.

FIG. 6 gives examples of suitable ammonium bases that can be used in the photoresist.

FIG. 7 describes the structure of PPTHH, poly(1,1,2,3,3-pentagluoro-4-trifluoromethyl-4hydroxy-1,6-eptadiene), which is a mixture of 5 and 6 membered rings.

FIG. 8 describes fluoroacohol polymers made from polymerization of either alicyclic moieties (I) or fluorinated dienes (II).

DESCRIPTION OF THE INVENTION

The present invention relates to a novel photoresist composition comprising a photoacid generator and at least one novel polymer comprising at least one unit of an aliphatic cyclic fluoroalcohol group functionalized with an alkyloxycarbonylalkyl group, as described by structure 1,

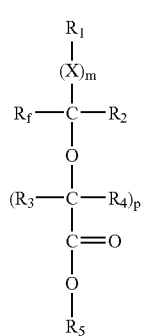

(1)

where, either (i) $R_1$ is an aliphatic cyclic unit of a polymer, $R_2$ is selected from H, F, ($C_1$-$C_8$)alkyl, ($C_1$-$C_8$)fluoroalkyl, cycloalkyl, cyclofluoroalkyl, and ($CR_3R_4$)p(CO)$OR_5$, and $R_f$ is selected from F, H, ($C_1$-$C_8$)alkyl, or a fully or partially fluorinated alkyl, and cyclofluoroalkyl, or (ii) $R_1$ and $R_2$ combine to form an aliphatic cyclic unit of a polymer, and $R_f$ is selected from F, H, ($C_1$-$C_8$)alkyl and a fully or partially fluorinated alkyl, and cyclofluoroalkyl, or (ii) $R_1$ and $R_f$ combine to form an aliphatic cyclic unit of a polymer, and $R_2$ is selected from H, F, ($C_1$-$C_8$)alkyl, ($C_1$-$C_8$)fluoroalkyl, cycloalkyl, cyclofluoroalkyl, and ($CR_3R_4$)p(CO)$OR_5$; and, $R_3$ and $R_4$ are independently H, F, ($C_1$-$C_8$)alkyl, ($C_1$-$C_8$)fluoroalkyl, cycloalkyl, cyclofluoroalkyl, ($CR_3R_4$)p(CO)$OR_5$, $R_3$ and $R_4$ may combine to form an alkylspirocyclic or a fluoroalkylspirocyclic group, X is selected from ($C_1$-$C_8$)alkylene, ($C_1$-$C_8$)fluoroalkylene, $O(C_1$-$C_8$)alkylene, $O(C_1$-$C_8$)fluoroalkylene, cycloalkyl and fluorinatedcycloalkyl, $R_5$ is H or an acid labile group, m=0-1, and p=1-4.

This composition is particularly useful for imaging in the range of 100-300 nm, and more particularly for 157 nm and 193 nm, and even more particularly for 157 nm. The invention further relates to a process for imaging the novel photoresist, particularly at wavelengths in the range 100 nm-200 nm, and more particularly for imaging at 193 nm and 157 nm.

In the present application, the functionality alkyloxycarbonylalkyl (AOCA) is represented by —($CR_3R_4$)p(CO)$OR_5$, and the functionality referred to as the aliphatic cyclic fluoroalcohol is represented by $R_1$(X)mC($R_fR_2$)O—H, as shown in structure 1. Typically, the aliphatic cyclic fluoroalcohol is reacted with a compound capable of providing the AOCA group to form the novel polymer comprising at least one unit of structure 1.

The polymer of the invention may be alkali insoluble or essentially alkali insoluble, i.e. when $R_5$ is an acid labile group. Alternatively, the polymer of the invention may be alkali soluble, i.e. when $R_5$ is hydrogen. When the polymer is alkali soluble a dissolution inhibitor is required to make the unexposed area insoluble to the developer. However, when the polymer has an acid labile group, then during exposure the photoacid generator forms an acid, which further cleaves the $R_5$ group either by acidolysis or hydrolysis to give a polymer which is now essentially alkali soluble. Examples of acid labile groups, without limitation, are secondary and tertiary alkyls (up to 20 carbon atoms) with at least one β hydrogen, acetals and ketals, trimethylsilyl, and β-trimethylsilyl substituted alkyls. Representative examples of acid labile groups are tert-butyl, tert-pentyl, isobornyl, 1-alkylcyclohexyl, 1-alkylcyclopentyl, cyclohexyl, 2-alkyl-2-adamantyl, 2-alkyl-2-norbornyl. Other examples of acid labile groups are tetrahydrofuranyl, tetrahydropyranyl, substituted or unsubstituted methoxycarbonyl, β-trialkylsilylalkyl groups (e.g. $CH_2$—$CH_2Si(CH_3)_3$, $CH(-CH_2Si(CH_3)_3)_2$, $CH_2$—$CH(Si(CH_3)_3)_2$ and the like.

The polymer of this invention comprises at least one unit of structure 1, where the unit comprises at least one non-aromatic aliphatic cyclic group which is part of the polymer backbone and which may be monocyclic or multicyclic. Aliphatic cyclic groups are important since they provide the necessary dry etch resistance to the photoresist. The AOCA group is pendant from an aliphatic cyclic group which may be multicyclic or monocyclic. In one embodiment of the invention $R_1$ is a multicyclic or a monocyclic unit which is part of the polymeric backbone. In another embodiment $R_1$ and $R_2$ or $R_1$ and $R_f$ combine to form a multi or monocyclic unit, which is part of the polymeric backbone.

Typically multicyclic groups are those derived from the norbornene based monomers, and examples of such multicyclic monomers that may be used to form the polymer of the present invention are represented in FIG. 1.

The multicyclic monomers of FIG. 1 are generic structures of the multicyclic monomers which are polymerized alone or with other monomers to give directly the polymer of the invention or polymerized to give the free fluoroalcohol bearing multicyclic polymer which can then be capped with the AOCA group.

Typically such multicyclic monomers are polymerized with an active metal catalyst, a palladium or nickel complex, such as described in Hoang V. Tran et al Macromolecules 35 6539, 2002, and incorporated herein by reference. For the capping of the fluoroalcohol groups, examples of compounds that can provide the AOCA group are, without limitation, t-butyl bromoacetate, t-butyl chloroacetate, t-butyl mesyloxyacetate, t-amyl bromoacetate, 2-methyl-2-adamantyl bromoacetate, 2-methyl-2-norbornyl bromoacetate, t-butyl 3-bromopropanoate, t-butyl-2-bromo-2,2-difluorobutanoate.

The multicyclic unit of FIG. 1 is substituted such that within the polymer at least one unit has the structure 1, but the cyclic group may also have other substituents. Typical substituents are H, F, alkyl, fluoroalkyl, cycloalkyl, fluorocycloalkyl, and cyano. Additionally, as referred to within FIG. 1, $R_1$ and $R_2$ or $R_5$ and $R_4$ or $R_6$ and $R_7$ substituents may together be part of a spiroalkyl or fluorospiroalkyl subsituent.

In the above definition and throughout the present specification, alkyl means linear or branched alkyl having the desirable number of carbon atoms and valence. Suitable linear alkyl groups include methyl, ethyl, propyl, butyl, pentyl, etc.; branched alkyl groups include isopropyl, iso, sec or tert butyl, branched pentyl etc. Fluoroalkyl refers to an alkyl group which is fully or partially substituted with fluorine, examples of which are trifluoromethyl, pentafluoroethyl, perfluoroisopropyl, 2,2,2-trifluroethyl, and 1,1-difluoropropyl. Alkylene refers to methylene, ethylene, propylene, etc. Alkylspirocyclic or fluoroalkylspirocyclic are cyclic alkylene structures connected to the same carbon atom, preferably where the ring contains from 4 to 8 carbon atoms, and further where the ring may have substituents, such as F, alkyl, and fluoroalkyl. Cycloalkyl or cyclofluoroalkyl are defined as aliphatic mono or multi cyclic rings containing carbon atoms and attached to a carbon atom, preferably cyclobutyl, cyclopentyl, cyclohexyl, cycloheptyl, cyclooctyl, norbornyl, adamantyl, etc., where the ring may be further substituted with fluorine, alkyl substituents or fluoroalkyl substituents.

More specifically, examples of preferred norbornene monomers containing the t-butoxycarbonylmethyl (BOCME) protecting group with the t-butyl acid labile group are shown below in FIG. 2, although other acid labile groups or where $R_5$ from structure 1 is hydrogen, may also be used.

In addition to where $R_1$ is the multicyclic unit in the polymer backbone, monocyclic repeat units may also be used, although multicyclic units are preferred in some cases. The monocyclic unit can have a ring structure where the number of atoms in the ring ranges from about 4 to about 10, preferably from 5 to about 8, and more preferably from about 5 to about 7.

In another embodiment, the substituents $R_1$ and $R_2$, or $R_1$ and $R_f$ in Structure 1 may also combine to give an aliphatic cyclic polymer, where m=0 or 1, i.e. X may or may not be present as part of the ring structure. The polymeric cyclic backbone may be hydrocarbon, or may additionally contain fluorinated substituents. The monocyclic units may additionally contain oxygen within the cyclic structure. Generally polymers having monocyclic repeat units can be made by using radical initiators either in bulk or in a solvent from suitable monomers, for example, by homopolymerization of an unconjugated diene or by the copolymerization of a unconjugated diene with an olefin (For examples of such polymerization methods see "Cyclopolymerization and Polymers with Chain Ring Structures, ACS Symposium Series 195 Edited by George Butler and Jiri E. Kresta, Chapter 2, 3 and 4). Such techniques could be used to form polymers with monocyclic backbones having the alcohol functionality either attached to the backbone or as part of a pendant group as shown in FIG. 3. Possible substituents on the cyclic structure may be selected from fluorine, alkyl, fluoroalkyl, cycloalkyl, cyclofluoroalkyl, alicyclic, or fluorinated alicyclic groups.

More specifically, the monocyclic polymers of the present invention could be made by radical homopolymerization of unconjugated asymmetrical partially fluorinated dienes or by copolymerization of a fluorinated unconjugated diene with an olefin, using a radical initiator either in bulk or in a solvent. (For examples of such polymerization reactions see Shun-ichi Kodama et al Advances in Resist Technology and Processing XIX, Proceedings of SPIE Vol. 4690 p 76 2002; WO 02/065212, or WO 01/98834-A1). In this manner the desired materials could either be made directly or through the intermediacy of a fluoroalcohol bearing polymer which could then be capped with the AOCA group.

Examples of alcohol or fluoroalcohol substituents or substituents containing moieties which are pendant from the cyclic moiety and which the AOCA group can protect are for example, without limitation: $R_1OH$, $R_1OCH_2(CF_2)_nOH$ (n=1-8), $R_1O(CF_2)_nOH$ (n=1-8), $R_1C(C_nF_{2n+1})_2OH$ (n=1-8), $R_1OCH_2(C_nF_{2n+1})_2OH$ (n=1-8), $R_1CH_2(C_nF_{2n-1})_2OH$ (n=1-8).

Typical examples of aliphatic partially fluorinated monocyclic monomers having pendant alcohol groups are described in FIG. 4, where the alcohol groups are further reacted with a reactant that can provide the AOCA group, preferably a reactant containing the BOCME functionality, to give the polymer of the present invention.

The polymer of the present invention comprises at least one unit of the structure 1. The polymer is preferably synthesized by polymerizing a monomer containing the monocyclic or multicyclic fluoroalcohol functionality, and further reacting the formed polymer with a compound containing the AOCA group, although it is within the scope of the present invention that the AOCA capped monomer may be polymerized to give the polymer of the present invention.

It is within the scope of this invention, and preferred, that the polymer (homopolymer or copolymer with multicyclic or monocyclic repeat units) containing the fluoroalcohol groups are only partially capped with the AOCA group, thus leaving some of the alcohol groups free and/or some of the hydroxyl groups capped with a group that is not acid labile, such as straight chain or branched chain alkyl groups, fluoroalkyl groups, partially fluorinated alkyl groups, acyl groups, especially groups with up to 20 carbon atoms or alkylsulfonates (e.g. triflate, mesylate or their higher analogs). Specifically, the hydroxyl may be capped with groups such as methyl or higher alkyl ($C_1$-$C_{12}$), partially or fully fluorinated alkyls ($C_1$-$C_{20}$), alkylsulfonyl ($SO_2C_nH_{2n+1}$, n=1-20), and fluoroalkylsulfonyl(up to $C_{20}$). More specifically, the hydroxyl group may be capped with groups such as $CF_3$—$CH_2$—, $(CF_3)_2$—CH—, $CF_3$—$CF_2$—$CH_2$—, $CF_3$—$SO_2$—, $CH_3$—$SO_2$—, and $CH_3$—CO—.

The polymer may be a homopolymer or may also be a copolymer, where other monomers are also incorporated into the polymer. Examples of other monomers having multicyclic repeat units are norbornene, norbornene derivatives capped with tert-butoxycarboxyl or alkoxycarbonyl, other nonaromatic aliphatic cyclic monomers and their derivatives, cyclic fluoralcohols, etc. Additionally for polymers having multicylic repeat units other units derived from fluorinated or partially fluorinated olefins may also be present. Monocyclic polymers comprising at least one unit of the structure 1 may also contain other repeat units derived from substituted unconjugated dienes and or substituted olefins, which are fully or partially fluorinated.

In another embodiment the copolymer comprises a unit of structure 1, a unit derived from an unsaturated monocyclic alcohol where the hydroxyl is capped with a non acid labile group and/or a unit derived from an unsaturated monocyclic alcohol where the hydroxyl group is capped with an acid labile group other than an AOCA group. Without limitations, examples of acid labile groups other than the AOCA group are t-BOC, alkyleneoxyalkyl groups, trialkylsilyl, 2-(trialkylsilyl)ethyl. Specific examples of these acid labile groups are methyloxymethyl, adamantylmethyloxymethyl, bicyclohexyloxymethyl, ethyloxymethyl, menthyloxymethyl, and cyclopentyloxymethyl.

The preferred multicyclic polymers are those derived from monomers of the type illustrated in structure I or II of FIG. 1, in which the fluoroalcohol moiety is protected with 2-100% AOCA groups. The preferred monocyclic polymers are polymers as described in FIG. 4, and more preferably poly(1,1,2,3,3-pentafluoro-4-fluoroalkyl-4-hydroxy-1,6-heptadiene) (as in FIG. 4(I)) protected with 2-100% of the AOCA group. The photoresist composition can comprise a mixture of polymers of the various embodiments of the present invention.

It is also within the scope of this invention that the polymer of the present invention is present in a blend with other secondary polymers. The copolymer with a mixture of capping groups, including AOCA group, and/or free hydroxyl group may also be blended with secondary polymers. These secondary polymers may be polymers with no acid labile groups, polymers with other acid labile groups that are not AOCA but may have acetal protecting groups such as MOM or acid cleavable alkoxycarbonyl (e.g. tert-butoxycarboxyl, t-BOC), alkyleneoxyalkyl groups, trialkylsilyl, 2-(trialkylsilyl)ethyl, specific examples of these acid labile groups are methyloxymethyl, adamantylmethyloxymethyl, bicyclohexyloxymethyl, ethyloxymethyl, menthyloxymethyl, and cyclopentyloxymethyl, or other polymers or copolymers. The secondary polymer may comprise a monocyclic polymer with only pendant hydroxyl groups. Additionally, the secondary polymers may comprise a monocyclic polymer with pendant hydroxyl groups, pendant hydroxyl groups with capped acid labile groups other than AOCA and/or partially fluorinated C1-$C_{12}$ alkyl groups. Examples of preferred secondary polymers are polymers with the structure of FIG. 4 partially capped with nonacid labile groups and/or acid labile groups other than AOCA. In certain cases it may be preferable that the polymers of this invention are used without secondary polymers.

Preferred multicyclic polymers blends are those polymers made from monomers of the type illustrated in structure I or II of FIG. 1, in which the fluoroalcohol moiety of one of the polymer blend is present in an amount from 2-98% and contains up to 40% total protection of AOCA and the other component is present in amount of 2 to 98% and consists of up to 40% AOCA groups, but both polymers have a different percentage of AOCA capping and/or different analogues of the AOCA group. The preferred monocyclic polymers blends are polymers such as those described in FIG. 4, and more preferably poly(1,1,2,3,3-pentafluoro-4-fluoroalkyl-4-hydroxy-1,6-heptadiene) (as in FIG. 4(I)) in which one of the polymer blend is present in an amount from 2-98% and contains up to 40% total protection of fluoroalcohol groups with AOCA and the other component is present in amount of 2 to 98% and has up to 40% protection of an AOCA group, but both polymers have a different percentage of AOCA capping and/or different analogues of the AOCA group. Blends with more than two components are also anticipated.

In a preferred embodiment the composition of the present invention comprises a photoacid generator and a polymer mixture of an aliphatic monocyclic polymer of this invention with an aliphatic multicyclic polymer of this invention, preferably, a blend of poly(1,1,2,3,3-pentafluoro-4-trifluoromethyl-4-hydroxy-1,6-heptadiene) protected with an AOCA group with poly(bicyclo[2.2.1]hept-5-en-2-yl)-1,1,1-trifluoro-2-(trifluoromethyl)propan-2-ol) protected with the AOCA group, and more preferably where the capping of the polymer with the AOCA group is in the range of 2-40%, and even more preferably where the AOCA group is the BOCME group.

In another preferred embodiment the polymer mixture comprises only a multicyclic polymer or only a monocyclic polymer of the present invention.

It is within the scope of the present invention that more than one AOCA group could be present on the same aliphatic cyclic unit, or that a mixture of AOCA and another acid labile group be present on the same aliphatic cyclic unit. It is envisaged that two BOCME or AOCA groups can be present on the same carbon atom (i.e. $C(OC(R')_2CO_2$-t-$Bu)_2$).

Preferred embodiments of the resin composition are as follows: poly(bicyclo[2.2.1]hept-5-en-2-yl)-1,1,1-trifluoro-2-(trifluoromethyl)propan-2-ol) protected with 5-100% BOCME group, poly(1,1,2,3,3-pentafluoro-4-trifluoromethyl-4-hydroxy-1,6-heptadiene) protected with 5-100% BOCME group and a blend of (5-95 weight %) of poly (bicyclo[2.2.1 ]hept-5-en-2-yl)-1,1,1-trifluoro-2-(trifluoromethyl)propan-2-ol) protected with 5-100% BOCME group mixed with poly(1,1,2,3,3-pentafluoro-4-trifluoromethyl-4-hydroxy-1,6-heptadiene) protected with 5-100% BOCME group. More preferably the extent of protection of the polymer by the BOCME group is in the range from about 9% to about 40%.

The extent of functionalization of the polymer with the AOCA group or the extent of blending with other polymers is determined by the lithographic properties of the photoresist, in particular the level of acceptable loss of the unexposed photoresist film (dark film loss) in the developer, phase compatibility, etc. Typically the degree of functionalization can range from about 1 mole % to about 100 mole %, and preferably from about 9 mole % to about 40 mole %.

The polymers of this invention comprise one or more units that contain an AOCA protecting group. Upon exposure the AOCA protecting group undergoes acidolysis or hydrolysis to form a free carboxylic acid, thereby making the polymer soluble in the alkali developer for a positive photoresist. The polymer may be capped with a protecting group after polymerization or the monomer(s) may be capped with a protecting group and then polymerized. The polymer may also be inhibited by a dissolution inhibitor, and upon exposure the photoresist then becomes soluble in the developer. Typically dissolution inhibitors are added to the photoresist to decrease the dissolution rate of the unexposed photoresist in the developer. A polymer of this invention, where $R_5$ is hydrogen, as shown in structure 1, would be alkali soluble and is useful when mixed with a dissolution inhibitor and a photoacid generator. Examples of known dissolution inhibitors that may be used are monomeric or oligomeric cholates, photoactive compounds which also act as dissolution inhibitors, such as diaryliodonium or triphenylsulfonium salts of strong acids in which one or more of the aryl group has either a hydroxyl substituent, a carboxylic acid substituent, or a perfluoroisopropylalcohol substituent protected with a group susceptible to acidolysis by the release of a photoacid.

Transparency of the polymers in a photoresist is an important requirement. Thus, the absorption coefficient of the resin film is less than 4/micron at the exposure wavelength, typically 157 nm, preferably 3/micron and more preferably less than 2/micron and even more preferably less than 1/micron.

It is preferred if the polymers employed in such formulations have a weight average molecular weight from about 1,000 to about 200,000, preferably from about 4,000 to about 20,000, more preferably from about 6,000 to about 14,000.

The polymer of the present invention can be synthesized by reacting the polymer containing the aliphatic cyclic fluoroalcohol group with the compound containing the AOCA functionality. As an example, either the cyclic monomers containing the hydroxyl group are polymerized, as illustrated in FIG. 1, or the polymers illustrated in FIGS. 3 and 4, may be reacted with t-butyl bromoacetate or 2-methyl-2-adamantyl bromoacetate. This reaction takes place in the presence of a base. In the present invention it has been found that organic bases, especially, ammonium bases, phosphonium bases and sulfonium bases, provide superior results. Preferably the bases are alkylated. Typically, $(R_1')(R_2')(R_3')(R_4')$NOH are preferred, where $R_1', R_2', R_3'$ and $R_4'$ are independently ($C_1$-$C_{20}$) alkyl; examples of such alkyls are linear and branched alkyls, e.g. methyl, ethyl, propyl, isopropyl, butyl, etc. Preferred bases are tetramethyl ammonium hydroxide and tetrabutyl ammonium hydroxide. The bases may be present as hydrates, aqueous or methanolic solutions, although aqueous solutions are preferred. Mixtures of organic bases may be used. The reaction mixture may additionally comprise ammonium salts, posphonium salts or sulfonium salts, which may function as phase transfer catalysts for the reaction. Examples of such salts are alkylated ammonium salts, such as $(R_1'R_2'R_3'R_4')$NX, and alkylated phosponium salts, such as $(R_1')(R_2')(R_3')(R_4')$PX, where $R_1', R_2', R_3'$ and $R_4'$ are independently ($C_1$-$C_{20}$) alkyl and X is any anion, such as chloride, bromide, and hydrogensulfate. Although, alkylated bases have been discussed, aromatic or mixed aromatic and alkylated bases and salts may also be used. The reaction components are mixed in an appropriate solvent, typically acetonitrile, dichloromethane, dioxane, acetone/water, tetrahydrofuran, etc. The reaction is carried out using suitable conditions of reaction time and temperature. Typically, the reaction is carried out at temperatures ranging from about −30° C. to about 80° C., and more typically between about 0° C. to about 25° C. The reaction time can range from about 30 minutes to about 72 hours, preferably about 5 hours to about 24 hours, and more preferably about 10 hours to about 18 hours. The polymer is precipitated out and purified using standard techniques.

Polymers of high purity and with good yields are obtained, typically having yields in excess of 80%, preferably greater than 85%, and more preferably greater than 90%. The organic base is removed by acids such as, acetic acid, formic acid, hydrochloric acid, etc.

Additionally, the use of tetraalkylammonium salts having at least one C4 alkyl (or higher) moiety gives smoother reaction requiring less reaction time and/or use of less excess of the AOCA reagent (e.g. t-butyl bromoacetate). Tetraalkylammonium bases having at least one $C_4$ alkyl (or higher up to C20) moiety can be used either as neat hydroxide bases or employed along with another hydroxide base such as tetrabutylammonium hydroxide or sodium hydroxide. Also, tetraalkylammonium salt with at least one $C_4$ alkyl (or higher up to $C_{20}$) moiety can be added to be used along with a hydroxide base such as tetramethylammonium salt to improve reaction speed and/or yield. When used as a supplementary hydroxide base or as a salt additive tetraalkylammonium derivatives having at least one $C_4$ alkyl (or higher up to $C_{20}$) can be used in quantities ranging from 5 wt % to 50 wt % of the initial hydroxide base amount. It is envisaged that the alkyl group of the base and the salt could be substituted with aryl moieties (e.g benzyl and the like). It is further envisaged that other onium salts could be used as additives to improve reactivity (e.g. phosphonium, sulfonium and the like).

The photoacid generator (PAG) of the novel composition is selected from those which absorb at the desired exposure wavelength, preferably 193 nm and 157 nm. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation that may be used, are triazines, oxazoles, oxadiazoles, thiazbles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also possible candidates. Mixtures of photoactive compounds may also be used.

FIG. 5 shows examples of PAG structures, such as onium salts and hydroxyamic derivatives which are useful.

The photoresist of the present invention comprises the novel polymer, a photoacid generator, and optionally a base additive. In some cases bases or photoactive bases are added to the photoresist to control the profiles of the imaged photoresist and prevent surface inhibition effects, such as T-tops. Nitrogen containing bases are preferred, specific examples of which are amines, such as triethylamine, triethanolamine, aniline, ethylenediamine, pyridine, tetraalkylammonium hydroxide or its salts. Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (eg. $CF_3CO_2^-$) or nucleophilic acids (eg $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

FIG. 6 shows the structures of ammonium derivatives which might be employed as bases.

The use of non volatile amine additives is also possible. Preferred amines would be ones having a sterically hindered structure so as to hinder nucleophilic reactivity while maintaining basicity, low volatility and solubility in the resist formulation, such as a proton sponge, 1,5-diazabicyclo[4.3.0]-5-nonene, 1,8-diazabicyclo[5,4,0]-7-undecene, cyclic akylamines, or polyether bearing amines such as described in U.S. Pat. No. 6,274,286.

Furthermore, it is within the scope of this invention that the photoresist further comprises dissolution inhibitors. Thus, BOCME or AOCA groups could be employed without a protective acid labile moiety that is where R5 is hydrogen (e.g. $—CH_2CO_2H$). In one embodiment the carboxylic acid could be present with another unit with the AOCA protecting group and used to regulate the dissolution rate of the photoresist. In this concept the amount of AOCA containing units would be determined by the need to maintain low dark erosion while increasing the dissolution rate in the exposed areas. Typically, dissolution inhibitors are added to the photoresist to decrease the dissolution rate of the unexposed photoresist in the developer.

The photoresist composition is formed by blending the ingredients in a suitable photoresist solvent. In the preferred embodiment, the amount of polymer in the photoresist preferably ranges from 90% to about 99.5% and more preferably from about 95% to about 99% based on the weight of the solid; i.e., non-solvent photoresist components. In the preferred embodiment, the photoactive compound is present in the photoresist in an amount of from about 0.5% to about 10% preferably from about 4% to about 6% based on the weight of the solid photoresist components. In producing the photoresist composition, the solid components of the photoresist are mixed with a solvent or mixtures of solvents such as propylene glycol mono-alkyl ether, propylene glycol alkyl ether acetate, butyl acetate, xylene, 1,3-di(trifluoromethyl)benzene, ethylene glycol monoethyl ether acetate, propylene glycol mono-methyl ether acetate, 2-heptanone, ethyl lactate, ethyl-3-ethoxypropionate, and mixtures of ethyl lactate and ethyl-3-ethoxypropionate, among others.

The prepared photoresist composition solution can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group IIIN compounds. The photoresist may also be coated over antireflective coatings.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 160° C., and more preferably from about 95° C. to about 135° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 160° C., more preferably from about 100° C. to about 130° C. The heating may be conducted for from about 30 seconds to about 5 minutes, more preferably from about 60 seconds to about 90 seconds on a hot plate or about 15 to about 45 minutes by convection oven.

The exposed photoresist-coated substrates are developed to remove the image-wise exposed areas by immersion in a developing solution or developed by spray, puddle or spray-puddle development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides or supercritical carbon dioxide. One preferred developer is an aqueous solution of tetramethyl ammonium hydroxide. Surfactants may also be added to the developer composition. After removal of the coated wafers from the developing solution, one may conduct an optional post-development heat treatment or bake to increase the coating's adhesion and chemical resistance to etching conditions and other substances. The post-development heat treatment can comprise the baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid etching solution or preferably, dry etching. In some cases metals are deposited over the imaged photoresist.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Glossary

TGA thermogravimetric analysis
UV ultraviolet
MOM methoxymethyl
MeOH methanol
mmol millimole ie $10^{-3}$ moles
BOCME (tert-butoxycarbonyl)methyl
t-BOC tert-butoxycarbonyl
THP tetrahydropyranyl
PAG photoacid generator
IPA isopropyl alcohol
THF tetrahydrofuran
TMAH tetramethylammonium hydroxide
t-BuOK potassium tert-butoxide
BHTTP 3-(bicyclo[2.2.1]hept-5-en-2-yl)-1,1,1-trifluoro-2-(trifluoromethyl)propan-2-ol,
CMAdOM Carb-2-methyl-2adamantyloxymethyl,
BCHOM Bicyclohexyloxymethyl
AdMOM Adamantylmethyloxymethyl
PBHTTP Poly(3-(bicyclo[2.2.1]hept-5-en-2-yl)-1,1,1-trifluoro-2-(trifluoromethyl)propan-2-ol), purchased from Promerus LLC
9921 Brecksville Road, Bldg B, Brecksville Ohio 44141

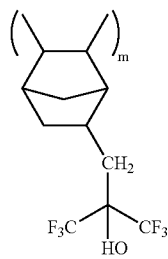

PTHH 1,1,2,3,3-pentafluoro-4-trifluoromethyl-4-hydroxy-1,6-heptadiene PPTHH poly(1,1,2,3,3-pentafluoro-4-trifluoromethyl-4-hydroxy-1,6-heptadiene) which is a mixture of 5 and 6 membered rings, purchased from Asahi Glass Co, LTD, 2-1-2 Marunouchi, Chiyoda-ku Tokyo 100-8305 Japan,

Example 1

Table 1 shows the TGA onset of deprotection of MOM and t-boc compared to that found for the deprotection with the BOCME group on representative examples of polymers (FIG. 6) belonging to the two classes of cyclic fluoroalcohol bearing polymer described earlier.

TABLE 1

Onset of deprotection of polymers I and II with various protecting groups*

| Protecting group | Polymer (% protection) | Onset of Deprotection (° C.) |
|---|---|---|
| BOCME | II (30%) | 174 |
| BOCME | I (30%) | 206 |
| T-BOC | I (30%) | 120 |
| MOM | II (20%) | <100 |

*Data gathered at 20° C./min heating rate

Table 1 clearly shows that polymers with the BOCME group thermally deprotect at a higher temperature than the same polymer with the t-boc and MOM groups.

Example 2

The contrasts of resists were measured by coating them at a thickness of 1350 A (Angstroms) and after exposure using an open frame reticle baking and developing the film and measuring the normalized thickness as a function of dose. The contrast is taken from the slope of plot of normalized thickness versus log(dose). Processing conditions were as follows:

The exposures were done an Exitech 157 nm small field (1.5 mm×1.5 mm) mini-stepper (0.6 NA) using open frame exposure reticle at International SEMATECH in Austin. An FSI Polaris 2000 track was used to coat, bake, and develop the resist films. A Prometrix interferometer was used to measure resist thickness.

The photoresist formulations preparation and resultant contrasts are as follows:

By mixing the following dry ingredients poly(tert-Butyl Bicyclo[2.2.1]hept-5-ene-2-carboxylate-co-1,1,1-trifluoro-2-(trifluoromethyl)pent-4-en-2-3-(Bicyclo[2.2.1]hept-5-en-2yl)-1,1,1-trifluoro-2-(trifluoromethyl)propan-2-ol) (75.3%) poly(tert-Butyl 3-(trifluoromethyl)tricyclo[4.2.1.02,5]non-7-ene-3-carboxylate-co-carbon monoxide (18.8%), triphenylsulfonium nonaflate (5.6%) and tetramethyammonium acetate (0.3%) as a 10% solution in propyleneglycol methylether acetate gives contrasts of 6-7 while similar formulations containing as dry ingredients 93% poly(1,1,1-trifluoro-2-(trifluoromethyl)pent-4-en-2-3-(Bicyclo[2.2.1] hept-5-en-2-yl) functionalized with BOCME (20% protection) (93% solids), triphenylsulfonium nonaflate (5.6%) and tetrabutylammonium acetate (0.5%) typically give contrasts of ~12-25 using different post applied bakes (PAB's) (from 135-150° C.) or PEB (115-150° C.) and developments times of 30 seconds with 0.26 N tetramethylammonium hydroxide.

Example 3

Synthesis of BOCME Protected Poly(3-(bicyclo [2.2.1]hept-5-en-2-yl)-1,1,1-trifluoro-2-(trifluoromethyl)propan-2-ol) using t-BuOK Poly(3-(bicyclo[2.2.1]hept-5-en-2-yl)-1,1,1-trifluoro-2-(trifluoromethyl)propan-2-ol) (PBHTTP) (4.0 g, 14.59 mmol) was dissolved into 15 ml of tetrahydrofuran (THF), and solid t-BuOK (0.491 g, 4.38 mmol) was added while stirring. After 30 minutes, t-butyl bromoacetate (1.71 g, 8.76 mmol) was added to this reaction solution which was stirred for 16 hours at 25° C. After removal of the solvent using a rotary evaporator, the resultant residue was dissolved in 20 ml of methanol (MeOH) containing 1.0 g of concentrated HCl. This solution was then precipitated in 180 ml of water-methanol (8:1). The polymer was isolated by filtration and further purified by dissolving it into MeOH and re-precipitating it in the water-methanol mixture. The final precipitate was then filtered, washed with water and dried overnight under vacuum (25" Hg) at 55° C. The isolated yield of polymer was 91%. The presence of t-butyl and methylene groups were confirmed by $^1$H-NMR (ppm, acetone-$d_6$) δ 1.48 (9H, t-butyl) and δ 4.27 (2H, —$CH_2$—COO—). The extent of protection with BOCME group was found to be 24 mole %.

Example 4

Synthesis of BOCME Protected Poly(3-(bicyclo [2.2.1]hept-5-en-2-yl)-1,1,1-trifluoro-2-(trifluoromethyl)propan-2-ol) using TMAH.5H$_2$O PBHTTP (4.0 g, 14.59 mmol) was dissolved in 15 ml of THF and solid TMAH.5H$_2$O (0.793 g, 4.38 mmol) was added while stirring. After 30 minutes, t-butyl bromoacetate (1.71 g, 8.76 mmol) was added to this solution which was stirred for another 16 hours at 25° C. The precipitate formed in the reaction mixture was removed by filtration. The resultant filtrate was stripped of solvents in a rotary evaporator. The resultant residue was redissolved in 20 ml of MeOH containing 1.0 g of concentrated HCl. This solution was precipitated in 180 ml of water-methanol (8:1) mixture. The polymer was isolated by filtration and further purified by dissolving it into MeOH and re-precipitating it in the water-methanol mixture. The final precipitate was then filtered, washed with water and dried overnight under vacuum (25" Hg) at 55° C. The isolated yield of polymer was 91%. The presence of t-butyl (1.48 ppm) and methylene (4.27 ppm) groups were confirmed by $^1$H NMR. The extent of protection with BOCME group was found to be 28 mole %.

Example 5

Synthesis of BOCME Protected PBHTTP using 25% aqueous TMAH

PBHTTP (4.0 g, 14.59 mmol) was dissolved in 15 ml of THF and 25% aqueous tetramethylammonium hydroxide (TMAH) (1.6 g, 4.38 mmol) was added while stirring. After 30 minutes, t-butyl bromoacetate (1.71 g, 8.76 mmol) was added to this reaction solution which was stirred for 16 hours at 25° C. After removal of the solvent using a rotary evaporator, the resultant residue was dissolved in 20 ml of MeOH containing 1.0 g of concentrated HCl. This solution was then precipitated in 180 ml of water-methanol (8:1) mixture. The polymer was isolated by filtration and further purified by dissolving it into MeOH and re-precipitating it in the water-methanol mixture. The final precipitate was then filtered, washed with water and dried overnight under vacuum (25" Hg) at 55° C. The isolated yield of polymer was 92%. The presence of t-butyl (1.48 ppm) and methylene (4.27 ppm) groups were confirmed by $^1$H NMR. The extent of protection with BOCME group was found to be 21 mole %.

Example 6

Synthesis of BOCME Protected PBHTTP using 25% TMAH in MeOH

PBHTTP (4.0 g, 14.59 mmol) was dissolved in 15 ml of THF and the 25% TMAH in methanol (1.6 g, 4.38 mmol) was added while stirring. After 30 minutes, t-butyl bromoacetate (1.71 g, 8.76 mmol) was added to this reaction solution which was stirred for 16 hours at 25° C. After removal of the solvent using a rotary evaporator, the resultant residue was dissolved in 20 ml of MeOH containing 1.0 g of concentrated HCl. This solution was then precipitated in 180 ml of water-methanol (8:1). The polymer was isolated by filtration and further purified by dissolving it into MeOH and re precipitating it in the water-methanol mixture. The final precipitate was then filtered, washed with water and dried overnight under vacuum (25" Hg) at 55° C. The isolated yield of polymer was 90%. The presence of t-butyl (1.48 ppm) and methylene (4.27 ppm) groups were confirmed by $^1$H NMR. The extent of protection with BOCME group was found to be 22 mole %.

Example 7

Synthesis of BOCME Protected PBHTTP using K$_2$CO$_3$ and 18-crown-6 ether

A solution was prepared in a small round bottomed flask consisting of the PBHTTP (2.0 g, 7.29 mmol), t-butyl bromoacetate (1.42 g, 7.29 mmol), and 18-crown-6 ether (0.19 g, 0.73 mmol) dissolved in 6 ml of dry THF under nitrogen equipped with a reflux column, a magnetic stirring bar and a heating mantle. To this solution was added anhydrous K$_2$CO$_3$ (1.26 g) and the solution was vigorously stirred overnight, while under reflux. After this time the reaction mixture was filtered and the filtrate was stripped of solvents in a rotary evaporator. The filtrate was then re-dissolved into 40 ml of ethyl acetate and washed with several 10 ml aliquots of distilled water until a neutral pH was detected in the water washings. The washed ethyl acetate solution was stripped of solvents in a rotary evaporator and further dried under 1 torr of vacuum at 35° C. for an hour producing a hard foam. This foam was re-dissolved in 30 ml of THF and precipitated into 300 ml of distilled water. This material was filtered, washed with distilled water and air dried for an hour. The recovered material was re-precipitated in the same fashion two more times. The final precipitate was then dried under vacuum (25" Hg) at 55° C., overnight. The isolated yield of the polymer was 62%. The presence of t-butyl (1.48 ppm) and methylene (4.27 ppm) groups were confirmed by $^1$H NMR. The extent of protection of the polymer with BOCME group was found to be 100 mole %.

Example 8

Synthesis of poly(1,1,2,3,3-pentafluoro4-trifluoromethyl-4-hydroxy-1,6-heptadiene) from its methoxymethyl Derivative Ten grams of poly(1,1,2,3,3-pentafluoro-4-trifluoromethyl-4-hydroxy-1,6-heptadiene) protected with 20% of MOM group was dissolved in 30 ml of THF and mixed with 10 ml of trifluoroacetic acid and 7.5 ml of water. This homogeneous solution was stirred overnight at room temperature. After reaction the solvents were stripped at 50° C. in a rotary evaporator. The residue was dissolved in 30 ml of IPA and precipitated in 750 ml of cold water. The precipitate was filtered, washed and dried under vacuum (25" Hg) at 55° C. The isolated yield of the polymer was 98%. NMR analysis confirmed the absence of MOM group.

Example 9

Synthesis of BOCME Protected poly(1,1,2,3,3-pentafluoro-4-trifluoromethyl-4-hydroxy-1,6-heptadiene) using t-BuOK Poly(1,1,2,3,3-pentafluoro-4-trifluoromethyl-4-hydroxy-1,6-heptadiene) (4.0 g, 14.81 mmol) (PPTHH) from Example 8 was dissolved in 15 ml of THF and to this solution was added solid t-BuOK (0.5 g, 4.44 mmol) while stirring. After 30 minutes, of stirring at 25° C., t-butyl bromoacetate (1.74 g, 8.88 mmol) was added to this reaction solution and it was stirred for another 16 hours at 25° C. After this time, the precipitate formed during the reaction was removed by filtration. The resultant filtrate was then stripped of solvent in a rotary evaporator. The residue was re-dissolved in 20 ml of MeOH containing 1.0 g of concentrated HCl. This solution was then precipitated in 200 ml of 15% MeOH in water. The precipitate was filtered, washed with distilled water and dried. The polymer was further purified by re-dissolving it in MeOH and re-precipitating it in water. After drying under vacuum (25" Hg) at 55° C., the yield of polymer was 92%. The presence of t-butyl (1.48 ppm) and methylene (4.27 ppm) groups were confirmed by $^1$H NMR. The extent of protection with BOCME group was found to be 22 mole %.

Example 10

Synthesis of BOCME Protected PPTHH using TMAH.5H$_2$O

PPTHH (4.0 g, 14.81 mmol) from Example 8 was dissolved in 15 ml of THF and to this solution was added solid TMAH.5H2O (0.81 g, 4.44 mmol) while stirring. After 30 minutes, of stirring at 25° C., t-butyl bromoacetate (1.74 g, 8.88 mmol) was added to this reaction solution and stirred for another 16 hours at 25° C. After this time, the precipitate formed during the reaction was removed by filtration. The resultant filtrate was then stripped of solvent in a rotary evaporator. The residue was re-dissolved in 20 ml of MeOH containing 1.0 g of concentrated HCl. This solution was then precipitated in 200 ml of 15% MeOH in water. The precipitate was filtered, washed with distilled water and dried. The polymer was further purified by re-dissolving it in MeOH and re-precipitating it in water. After drying under vacuum (25" Hg) at 55° C., the yield of polymer was 92%. The presence of t-butyl (1.48 ppm) and methylene (4.27 ppm) groups were confirmed by $^1$H NMR. The extent of protection with BOCME group was found to be 23 mole %.

Example 11

Synthesis of CMAdOM Protected poly(1,1,2,3,3-pentafluoro-4-trifluoromethyl-4-hydroxy-1,6-heptadiene) using 2-Methyl-2-adamantyl bromoacetate The polymer (2.0 g, 7.4 mmol) from Example 8 was dissolved in 12 ml of THF and TMAH.5H$_2$O (0.4 g, 2.22 mmol) was added while stirring. After 30 minutes, 2-methyl-2-adamantyl bromoacetate (1.28 g, 4.44 mmol) was added to this reaction solution and stirred for 16 hours at 25° C. The solid formed in the reaction mixture was separated by filtration. The solvent in the filtrate was then stripped of solvent in a rotary evaporator and the residue was dissolved in 20 ml of MeOH containing 1.0 g of concentrated HCl. It was precipitated in 200 ml of 15% MeOH in water. The precipitate was filtered, washed with water and dried. The polymer was further purified by dissolving in MeOH and re-precipitating in water. The polymer was dried under vacuum (25" Hg) at 55° C. The yield of polymer was 90%. The presence of 2-methyl-2-adamantyl (1.5-2.0 ppm) and methylene (4.27 ppm) groups were confirmed by $^1$H NMR. The extent of protection was found to be 25 mole %.

Preparation of Photoresist Solution and Imaging at 157 nm

The imaging work was done with an Exitech 157 nm small field (1.5_1.5 mm2) mini-stepper (0.6 NA) using a phase-shift mask (σ 0.3) at International SEMATECH in Austin, Tex. A JEOL JWS-7550 was used to obtain scanning electron micrographs. A Hitachi 4500 Microscope was used to obtain cross-sectional data. An FSI Polaris 2000 track was used to coat, bake, and develop the resist films. A Prometrix interferometer was used to measure resist thickness.

Example 12

Resist Solution Containing PBTTP

A solution was prepared from 6.58 wt % PBTTP as prepared in example 4, 0.39 wt % triphenylsulfonium nonaflate, 0.03 wt % tetrabutylammonium acetate and 93 wt % propyleneglycolmonomethyl ether acetate (PGMEA). This solution was filtered through a 0.2 micron PTFE filter.

Example 13

Resist Solution Containing PPTHH

A solution was prepared from 6.58 wt % PPTHH as prepared in example 10, 0.39 wt % triphenylsulfonium nonaflate, 0.03 wt % tetrabutylammonium acetate and 93 wt % PGMEA. This solution was filtered through a 0.2 micron PTFE filter.

Example 14

Resist Solution Containing a 50/50 Mixture of PBTTP and PPTHH

A solution was prepared from 3.29 wt % PBTTP, as prepared in example 4, 3.29 wt % PPTHH, as prepared in example 10, 0.39 wt % triphenylsulfonium nonaflate, 0.03 wt % tetrabutylammonium acetate and 93 wt % PGMEA. This solution was filtered through a 0.2 micron PTFE filter.

Example 15

Imaging of Photoresist Solution Containing PBTTP

The photoresist solution prepared in example 12 was spin coated at 1658 rpm onto separately a bare silicon and a wafer coated with an organic antireflective coating. After post applied bake, 130° C./60s, a thickness of 1350 A resulted. After exposing at 157 nm using an open frame reticle, a post exposure bake of 115C/90s, and a development for 30s in 0.26 N TMAH were applied. This resulted in an exposure response curve from which a clearing dose of 7.2 mJ/cm$^2$ and a contrast of 12 were obtained. The wafer coated onto the antireflective coating coated silicon was exposed using a phase shift mask and the same processing conditions to give a resolution of 100 nm for 1:1.5 lines and spaces having a line width of 108 nm and an exposure dose of 51 mJ/cm$^2$.

Example 16

Imaging of Resist Solution Containing PPTHH

The resist solution prepared in example 13 was spin coated at 2220 rpm separately onto a bare silicon and a wafer coated with an organic antireflective coating. After a post applied bake of 150° C./60s a thickness of 1350 A resulted. After exposing at 157 nm using an open frame reticle, a post exposure bake of 135C/90s, and a development for 30s in 0.26 N TMAH, were applied. This resulted in an exposure response curve from which a clearing dose of 8.1 mJ/cm$^2$ and a contrast of 12 were obtained. The wafer coated onto the antireflective coating coated silicon was exposed using a phase shift mask and the same processing conditions to give resolution of 100 nm for 1:1.5 lines and spaces having a line width of 73 nm and an exposure dose of 69 mJ/cm$^2$.

Example 17

Imaging of Resist Solution Containing a 50/50 Mixture of PBTTP and PPTHH

The resist solution prepared in example 14 was spin coated at 1801 rpm separately onto a bare silicon and a wafer coated with an organic antireflective coating. After a post applied bake of 150C/60s, a thickness of 1350 A resulted. After exposing at 157 nm using an open frame reticle, a post exposure bake of 135C/90s, and a development of 30s in 0.26 N TMAH, were applied. This resulted in an exposure response curve from which an exposure dose of 10.2 mJ/cm$^2$ and a contrast of 10.2 were obtained. The wafer coated onto the antireflective coating coated silicon was exposed using a phase shift mask and the same processing conditions to give resolution of 100 nm for 1:1.5 lines and spaces having a line width of 80 nm and an exposure dose of 81 mJ/cm$^2$.

Example 18

Synthesis of poly(1,1,2,3,3-pentafluoro4-trifluoromethyl-4-hydroxy-1,6-heptadiene) from its methoxymethyl (MOM) Derivative One hundred grams of poly(1,1,2,3,3-pentafluoro4-trifluoromethyl-4-hydroxy-1,6-heptadiene) protected with 20% of MOM group was dissolved in 200 ml of THF and mixed with 30 ml of trifluoroacetic acid and 25 ml of water. This homogeneous solution was stirred 80° C. for 4 hours. The solvents of the reaction mixture were removed under vacuum at 50° C. The residue was dissolved in 200 ml of methanol and precipitated in 1 liter of water. The precipitate was filtered, washed and dried under vacuum at 70° C. The yield of the dry product, poly(1,1,2,3,3-pentafluoro-4-trifluoromethyl-4-hydroxy-1,6-heptadiene), was 96%. NMR analysis confirmed the absence of methoxymethyl group in the polymer.

Example 19

Synthesis of BOCME Protected poly(1,1,2,3,3-pentafluoro-4-trifluoromethyl-4-hydroxy-1,6-heptadiene) using 25% Aqueous TMAH The polymer in example 18 (20 g, 74 mmol) was dissolved in 120 ml of THF and 25% aqueous TMAH (13.5 g, 37 mmol) was added while stirring. After 30 minutes, t-butyl bromoacetate (3.4 g, 17.4 mmol) was added to this reaction solution and stirred for 3 days at room temperature. The solvent was removed using rotavap at 40° C. under vacuum and the residue was dissolved in 110 ml of MeOH. The solution was treated with 20 ml of glacial acetic acid at room temperature and was precipitated in water-methanol-acetic acid (280+10+10 ml) mixture. The precipitate was filtered, washed with water-methanol (140+60 ml), water (2 L) and dried. The polymer was further purified by dissolving in MeOH and precipitating in water and dried under vacuum at 70° C. for 16 hours. The yield of polymer was 92%. The presence of t-butyl (1.48 ppm) and methylene (4.27 ppm) groups were confirmed by $^1$H NMR. The extent of BOCME group incorporated was 20 mol %.

Example 20

Synthesis of BOCME Protected poly(1,1,2,3,3-pentafluoro-4-trifluoromethyl-4-hydroxy-1,6-heptadiene) using 25% Aqueous TMAH The polymer in example 18 (20 g, 74 mmol) was dissolved in 120 ml of THF and 25% aqueous TMAH (13.5 g, 37 mmol) was added while stirring. After 30 minutes, t-butyl bromoacetate (3.4 g, 17.4 mmol) was added to this reaction solution and stirred for 16 hours at 10° C. The solvent was removed using rotavap at 40° C. under vacuum and the residue was dissolved in 110 ml of MeOH. The solution was treated with 20 ml of glacial acetic acid at room temperature and was precipitated in water-methanol-acetic acid (280+10+10 ml) mixture. The precipitate was filtered, washed with water-methanol (140+60 ml), water (2 L) and dried. The polymer was further purified by dissolving in MeOH and precipitating in water and dried under vacuum at 70° C. for 16 hours. The yield of the polymer was 91%. The presence of t-butyl (1.48 ppm) and methylene (4.27 ppm) groups were confirmed by $^1$H NMR. The extent of BOCME group incorporated into the polymer was 23.5 mol %.

Example 21

Synthesis of BOCME protected poly(1,1,2,3,3-pentafluoro-4-trifluoromethyl-4-hydroxy-1,6-heptadiene) using 40% Aqueous tetrabutylammonium hydroxide(TBAH).

The polymer in example 18 (5 g, 18.5 mmol) was dissolved in 30 ml of THF and 40% aqueous TBAH (6 g, 9.26 mmol) was added while stirring. t-Butyl bromoacetate (0.98 g, 5 mmol) was added to this reaction solution and stirred for 16 hours at room temperature. The solvent was removed using rotavap at 40° C. under vacuum and the residue was dissolved in 50 ml of MeOH. The solution was treated with 10 ml of glacial acetic acid at room temperature and was precipitated in water-methanol-acetic acid (140+10+5 ml) mixture. The precipitate was filtered, washed with water-methanol (7+30 ml), water (1 L) and dried. The polymer was further purified by dissolving in MeOH and precipitating in water and dried under vacuum at 70° C. for 16 hours. The yield of the polymer was 90%. The presence of t-butyl (1.48 ppm) and methylene (4.27 ppm) groups was confirmed by $^1$H NMR. The extent of BOCME group incorporated into the polymer was 27 mol %.

Example 22

Synthesis of BOCME Protected poly(1,1,2,3,3-pentafluoro-4-trifluoromethyl-4-hydroxy-1,6-heptadiene) using 25% Aqueous TMAH and 40% Aqueous TBAH The polymer in example 18 (20 g, 74 mmol) was dissolved in 120 ml of THF and 25% aqueous TMAH (10.8 g, 29.62 mmol) and 40% aqueous TBAH (4.8 g, 7.4 mmol)

were added while stirring. t-Butyl bromoacetate (2.96 g, 15.2 mmol) was then added to this reaction solution and stirred for 16 hours at room temperature. The solvent was removed using rotavap at 40° C. under vacuum and the residue was dissolved in 110 ml of MeOH. The solution was treated with 20 ml of glacial acetic acid at room temperature and was precipitated in water-methanol-acetic acid (280+10+10 ml) mixture. The precipitate was filtered, washed with water-methanol (140+60 ml), water (2 L) and dried. The polymer was further purified by dissolving in MeOH and precipitating in water and dried under vacuum at 70° C. for 16 hours. The yield of the polymer was 93%. The presence of t-butyl (1.48 ppm) and methylene (4.27 ppm) groups was confirmed by $^1$H NMR. The extent of BOCME group incorporated into the polymer was 18 mol %.

Example 23

Synthesis of MOM and BOCME Protected poly(1,1,2,3,3-pentafluoro-4-trifluoromethyl-4-hydroxy-1,6-heptadiene) Starting from MOM Protected poly(1,1,2,3,3-pentafluoro-4-trifluoromethyl-4-hydroxy-1,6-heptadiene) Using 25% Aqueous TMAH The 15% MOM protected poly(1,1,2,3,3-pentafluoro-4-trifluoromethyl-4-hydroxy-1,6-heptadiene), (10 g, 31.5 mmol) was dissolved in 60 ml of THF and 25% aqueous TMAH (5.74 g, 15.73 mmol) was added while stirring. t-Butyl bromoacetate (0.8 g, 4.1 mmol) was then added to this reaction solution and stirred for three days at room temperature. The solvent was removed using rotavap at 40° C. under vacuum and the residue was dissolved in 80 ml of MeOH. The solution was treated with 15 ml of glacial acetic acid at room temperature and was precipitated in water-methanol-acetic acid (210+10+5 ml) mixture. The precipitate was filtered, washed with water-methanol (105+45 ml), water (1.5 L) and dried. The polymer was further purified by dissolving in MeOH and precipitated in water and dried under vacuum at 70° C. for 16 hours. The yield of polymer was 92%. The presence of t-butyl (1.48 ppm) and methylene (4.27 ppm) groups was confirmed by $^1$H NMR. The extent of BOCME group incorporated into the polymer was 11 mol %.

Example 24

Synthesis of MOM and BOCME Protected poly(1,1,2,3,3-pentafluoro-4-trifluoromethyl-4-hydroxy-1,6-heptadiene) Starting from MOM Protected poly(1,1,2,3,3-pentafluoro-4-trifluoromethyl-4-hydroxy-1,6-heptadiene) Using 25% Aqueous TMAH The 20% MOM protected poly(1,1,2,3,3-pentafluoro-4-trifluoromethyl-4-hydroxy-1,6-heptadiene) (10 g, 29.6 mmol) was dissolved in 60 ml of THF and 25% aqueous TMAH (5.4 g, 14.8 mmol) was added while stirring. t-Butyl bromoacetate (1.04 g, 5.33 mmol) was then added to this reaction solution and stirred for three days at room temperature. The solvent was removed using rotavap at 40° C. under vacuum and the residue was dissolved in 80 ml of MeOH. The solution was treated with 15 ml of glacial acetic acid at room temperature and precipitated in water-methanol-acetic acid (210+10+5 ml) mixture. The precipitate was filtered, washed with water-methanol (105+45 ml), water (1.5 L) and dried. The polymer was further purified by dissolving in MeOH and precipitating in water and dried under vacuum at 70° C. for 16 hours. The yield of the polymer was 91%. The presence of t-butyl (1.48 ppm) and methylene (4.27 ppm) groups was confirmed by $^1$H NMR. The extent of BOCME group incorporated into the polymer was 14 mol %.

Example 25

Synthesis of MOM and BOCME Protected poly(1,1,2,3,3-pentafluoro-4-trifluoromethyl-4-hydroxy-1,6-heptadiene) Starting from MOM Protected poly(1,1,2,3,3-pentafluoro-4-trifluoromethyl-4-hydroxy-1,6-heptadiene) Using 25% Aqueous TMAH The 20% MOM protected poly(1,1,2,3,3-pentafluoro-4-trifluoromethyl-4-hydroxy-1,6-heptadiene) (10 g, 30 mmol) was dissolved in 60 ml of THF and 25% aqueous TMAH (5.47 g, 15 mmol) was added while stirring. t-Butyl bromoacetate (0.71 g, 3.6 mmol) was then added to this reaction solution and stirred at 10° C. for 16 hours. The solvent was removed using rotavap at 40° C. under vacuum and the residue was dissolved in 80 ml of MeOH. The solution was treated with 15 ml of glacial acetic acid at room temperature and precipitated in water-methanol-acetic acid (210+10+5 ml) mixture. The precipitate was filtered, washed with water-methanol (105+45 ml), water (1.5 L) and dried. The polymer was further purified by dissolving in MeOH and precipitating in water and dried under vacuum at 70° C. for 16 hours. The yield of the polymer was 92%. The presence of t-butyl (1.48 ppm) and methylene (4.27 ppm) groups was confirmed by $^1$H NMR. The extent of BOCME group incorporated into the polymer was 12 mol %.

Example 26

Synthesis of bicyclohexyloxymethyl (BCHOM) and BOCME Protected poly(1,1,2,3,3-pentafluoro-4-trifluoromethyl-4-hydroxy-1,6-heptadiene) Starting from BCHOM Protected poly(1,1,2,3,3-pentafluoro-4-trifluoromethyl-4-hydroxy-1,6-heptadiene) Using 25% Aqueous

TMAH

The 8% BCHOM protected polymer (5 g, 16 mmol) was dissolved in 30 ml of THF and 25% aqueous TMAH (2.91 g, 8 mmol) was added while stirring. t-Butyl bromoacetate (0.56 g, 2.9 mmol) was then added to this reaction solution and stirred for three days at room temperature. The solvent was removed using rotavap at 40° C. under vacuum and the residue was dissolved in 50 ml of MeOH. The solution was treated with 15 ml of glacial acetic acid at room temperature and precipitated in water-methanol-acetic acid (140+10+5 ml) mixture. The precipitate was filtered, washed with water-methanol (70+30 ml), water (1 L) and dried. The polymer was further purified by dissolving in MeOH and precipitating in water and dried under vacuum at 70° C. for 16 hours. The yield of polymer was 93%. The presence of t-butyl (1.48 ppm) and methylene (4.27 ppm) groups were confirmed by $^1$H NMR. The extent of BOCME group incorporated into the polymer was 13 mol %.

Example 27

Synthesis of adamantylmethyloxymethyl (AdMOM) and BOCME Protected poly(1,1,2,3,3-pentafluoro-4-trifluoromethyl-4-hydroxy-1,6-heptadiene) Starting from poly(1,1,2,3,3-pentafluoro-4-trifluoromethyl-4-hydroxy-1,6-heptadiene) Using 25% Aqueous TMAH The polymer from example 18 (5 g, 18.5 mmol) was dissolved in 30 ml of THF and 25% aqueous TMAH (3.37 g, 9.26 mmol) was added while stirring. 1-Adamantylmethyloxymethyl chloride (0.32 g, 1.48 mmol) and t-Butyl bromoacetate (0.65 g, 3.33 mmol) were then added to this reaction solution and stirred for three days at room temperature. The solvent was removed using rotavap at 40° C. under vacuum and the residue was dissolved in 50 ml of MeOH. The solution was treated with 15 ml of glacial acetic acid at room temperature and precipitated in water-methanol-acetic acid (140+10+5 ml) mixture. The precipitate was filtered, washed with water-methanol (70+30 ml), water (1 L) and dried. The polymer was further purified by dissolving in MeOH and precipitating in water and dried under vacuum at 70° C. for 16 hours. The yield of polymer was 92%. The presence of t-butyl (1.48 ppm) and methylene (4.27 ppm) groups was confirmed by $^1$H NMR. The extent of AdMOM and BOCME group incorporated into the polymer were 6 and 14 mol % respectively.

Example 28

Synthesis of MOM and CMAdOM Protected poly (1,1,2,3,3-pentafluoro-4-trifluoromethyl-4-hydroxy-1,6-heptadiene) Starting from MOM Protected poly (1,1,2,3,3-pentafluoro-4-trifluoromethyl-4-hydroxy-1,6-heptadiene) Using 25% Aqueous TMAH The 15% MOM protected polymer (5 g, 15.73 mmol) was dissolved in 30 ml of THF and 25% aqueous TMAH (2.87 g, 7.87 mmol) was added while stirring. 2-Methyl-2-adamantyl bromoacetate (0.5 g, 1.73 mmol) was then added to this reaction solution and stirred for three days at room temperature. The solvent was removed using rotavap at 40° C. under vacuum and the residue was dissolved in 50 ml of MeOH. The solution is treated with 15 ml of glacial acetic acid at room temperature and was drowned in water-methanol-acetic acid (140+10+5 ml) mixture. The precipitate was filtered, washed with water-methanol (70+30 ml), water (1 L) and dried. The polymer was further purified by dissolving in MeOH and precipitating in water and dried under vacuum at 70° C. for 16 hours. The yield of the polymer was 93%. The presence of methylene (4.27 ppm) groups was confirmed by $^1$H NMR. The extent of CMAdOM group incorporated into the polymer was 7 mol %.

Example 29

Synthesis of MOM and BOCME Protected poly(1,1,2,3,3-pentafluoro-4-trifluoromethyl-4-hydroxy-1,6-heptadiene) Starting from MOM Protected poly (1,1,2,3,3-pentafluoro-4-trifluoromethyl-4-hydroxy-1,6-heptadiene) using 25% Aqueous TMAH The 19% MOM protected polymer (10 g, 30 mmol) was dissolved in 60 ml of THF and 25% aqueous TMAH (5.47 g, 15 mmol) was added while stirring. t-Butyl bromoacetate (0.71 g, 3.6 mmol) was then added to this reaction solution and stirred at room temperature for three days. The solvent was removed using rotavap at 40° C. under vacuum and the residue was dissolved in 80 ml of MeOH. The solution was treated with 15 ml of glacial acetic acid at room temperature and was precipitated in water-methanol-acetic acid (210+10+5 ml) mixture. The precipitate was filtered, washed with water-methanol (105+45 ml), water (1.5 L) and dried. The polymer was further purified by dissolving in MeOH and precipitating in water and dried under vacuum at 70° C. for 16 hours. The yield of polymer was 92%. The presence of t-butyl (1.48 ppm) and methylene (4.27 ppm) groups were confirmed by 1 H NMR. The extent of BOCME group incorporated was 9 mol %

Example 30

Photoresist solutions containing mixtures of polymers were evaluated for their lithographic properties. The 7 weight % photoresist solutions were made using 1.02 g of resin, 30.5 mg Triphenylsulfonium nonaflate, 2.5 mg Tetrabutylammonium Acetate, and 13.95 g PGMEA. The photoresists were filtered through a 0.2 micron filter. The resin comprised a mixture of MOM protected poly(1,1,2,3,3-pentafluoro-4-trifluoromethyl-4-hydroxy-1,6-heptadiene) and a 20% BOCME protected poly(1,1,2,3,3-pentafluoro-4-trifluoromethyl-4-hydroxy-1,6-heptadiene). Table 1 shows the various resin blends used and their mixing ratios. A MOM protected poly(1,1,2,3,3-pentafluoro-4-trifluoromethyl-4-hydroxy-1,6-heptadiene) with various degrees of protection was used for comparison. The photoresist film was coated onto a wafer coated with a silicon wafer with an organic bottom antireflective coating (900 A) at a thickness of 1350 A employing a spin speed of about 2,200 rpm followed by a bake at 135° C. for 60 seconds. Exposures were done with a 157 nm Excitech 0.85 NA exposure tool. After exposure a bake of 115° C. for 90 s was done followed by 30 s development in 0.26N TMAH developer. The exposures done to obtain 70 nm 1:1.5 LUS were performed using with a strong phase shift mask at a sigma setting of 0.3.

TABLE 1

Table of Lithographic Properties for resist made from polymer blends of polymers

| Photoresist Example | Polymer[1] | Resolution Dose mJ/cm2 70 nm 1:1.5 L/S | Eo mJ/cm2 | Contrast | Dark Film Loss % | abs @157 nm |
|---|---|---|---|---|---|---|
| 1 | 20F3MOM, 20F3BOCME 30/70 | 70.0 | 11.8 | 8.5 | 1.6 | 0.87 |
| 2 | 25F3MOM, 20F3BOCME 30/70 | 83.1 | 15.0 | 5.6 | 1.9 | 0.89 |
| 3 | 30F3MOM, 20F3BOCME 30/70 | 86.0 | 14.4 | 4.2 | 2.1 | 0.91 |

TABLE 1-continued

Table of Lithographic Properties for resist made from polymer blends of polymers

| Photoresist Example | Polymer[1] | Resolution Dose mJ/cm2 70 nm 1:1.5 L/S | Eo mJ/cm2 | Contrast | Dark Film Loss % | abs @157 nm |
|---|---|---|---|---|---|---|
| 4 | 35F3MOM, 20F3BOCME 30/70 | 80.5 | 14.8 | 5.2 | 2.6 | 0.89 |
| 5 | 40F3MOM, 20F3BOCME 30/70 | 85.2 | 14.6 | 5.9 | 3.3 | 0.92 |
| 6 | 25F3M0M, 20F3BOCME 50/50 | 83.0 | 14.6 | 6.2 | 2.6 | 0.83 |
| 7 | 30F3MOM, 20F3BOCME 50/50 | 84.6 | 14.8 | 6.5 | 2.7 | 0.86 |
| 8 | 35F3MOM, 20F3BOCME 50/50 | 91.0 | 15.0 | 9.7 | 3.0 | 0.87 |
| 9 | 40F3MOM, 20F3BOCME 50/50 | 93.2 | 15.2 | 20 | 2.7 | 0.89 |
| 10 | 25F3MOM, 20F3BOCME 70/30 | 83.7 | 14.6 | 6.2 | 4.3 | 0.78 |
| 11 | 30F3MOM, 20F3BOCME 70/30 | 88.2 | 14.8 | 6.0 | 4.1 | 0.80 |
| 12 | 35F3MOM, 20F3BOCME 70/30 | 94.9 | 15.4 | 25 | 2.9 | 0.83 |
| 13 | 40F3MOM, 20F3BOCME 70/30 | 104.5 | 16.8 | 19.5 | 2.0 | 0.83 |
| 14 | 35F3MOM | Does not resolve | 16.8 | 16 | 2.1 | 0.74 |
| 15 | 40F3MOM | Does not resolve | 19.0 | 15 | 2.4 | 0.76 |

[1]The notation for polymer composition is as follows: For example 20F3MOM, 20F3BOCME (30/70) means a blend consisting of 20% protected F3-MOM polymer with a 20% protected F3 BOCME in a ratio of 30 to 70 wt % respectively. For pure polymers 25MOMF3 denotes a resin made up of F3 protected with 25% of the MOM group.
F3 is poly(1,1,2,3,3-pentafluoro-4-trifluoromethyl-4-hydroxy-1,6-heptadiene)
Eo is the exposure energy to open large spaces
Dark Film Loss is the percentage of film lost in 0.26N TMAH developer for a 30s development time
Abs is the absorptivity of the photoresist film It was found that the photoresist composition comprising the physical blend of polymers gave superior lithographic performance compared to a photoresist with a single polymer capped with only the methoxymethyl group.

Example 31

Photoresist solutions comprising various copolymers were evaluated. The 7 weight % photoresist solutions were made using 1.02 g of resin, 30.5 mg triphenylsulfonium nonaflate, 2.5 mg tetrabutylammonium acetate, and 13.95 g PGMEA. The photoresist was filtered through a 0.2 micron filter. The resin for each solution were various copolymers of poly(1,1,2,3,3-pentafluoro-4-trifluoromethyl-4-hydroxy-1, 6-heptadiene) protected with BOCME and other acid labile groups as shown in Table 2.

A photoresist film was coated onto a wafer coated with a silicon wafer with an organic bottom antireflective coating (900 A) at a thickness of 1350 A employing a spin speed of about 2,200 rpm followed by a bake at 135° C. for 60 seconds. Exposures were done with a 157 nm Excitech 0.85 NA exposure tool. After exposure a bake of 115° C. for 90 s was done followed by 30 s development in 0.26N TMAH developer. The exposures done to obtain 70 nm 1:1.5 L/S were performed using with a strong phase shift mask at a sigma setting of 0.3.

TABLE 2

Table of Lithographic Properties for resist made from Copolymer

| Photoresist Example | Polymer[1] | $E_0$ mJ/cm2 | Resolution Dose 1:1.5 L/S mJ/cm2 | Contrast | Dark Film Loss % | abs @157 nm |
|---|---|---|---|---|---|---|
| 1 | 28(19MOM, 9BOCME) Polymer from Example 29 | 18.6 | 106.4 | 7.0 | 1.4 | 0.85 |
| 2 | 32 (20MOM, 12BOCME) Polymer from Example 25 | 15.6 | 102.2 | 18 | 1.4 | 0.94 |
| 3 | 20.5(7BCHOM, 13.5BOCME) Polymer from Example 26 | 11.2 | 60.8 | 15.2 | 1.7 | 1.11 |
| 4 | 20.4(6ADMOM, 14.4BOCME) Polymer from Example 27 | 15.2 | 75.5 | 7.5 | 1.9 | 1.12 |

[1]The polymer denotation is as follows the first number before parenthesis i.e 28 in 28(19MOM, 9BOCME) denotes the total protection level of the material. The notation within the parenthesis denotes the % content for each type of repeat unit in the polymer.
Eo is the exposure energy to open large spaces
Dark Film Loss is the percentage of film lost in 0.26N TMAH developer for a 30s development time
Abs is the absorptivity of the photoresist film

The invention claimed is:

1. A process for imaging a photoresist composition comprising the steps of:
   a) forming on a substrate a photoresist coating from a photoresist composition;
   b) image-wise exposing the photoresist coating;
   c) postexposure baking the photoresist coating; and
   d) developing the photoresist coating with an aqueous alkaline solution; and, where the photoresist composition comprises a photoacid generator and a fluorinated polymer, where the fluorinated polymer is a reaction product of polymer containing an aliphatic monocyclic fluoroalcohol unit with at least one compound capable of functionalizing the fluoroalcohol unit with an alkyloxycarbonylalkyl group of structure—$(CR_3 R_4)_p(CO)OR_5$, where $R_3$ and $R_4$ are independently H, F, $(C_1-C_8)$alkyl, $(C_1-C_8)$fluoroalkyl, cycloalkyl, cyclofluoroalkyl, $(CR_3R_4)_p(CO)OR_5$, $R_3$ and $R_4$ may combine to form an alkyispirocyclic or a fluoroalkylspirocyclic group, $R_5$ is H or an acid labile group, and p=1-4 further where the polymer containing the monocyclic fluoroalcohol unit is selected from at least one of structures I to VIII,

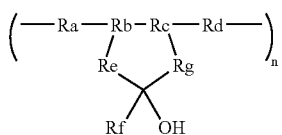

I

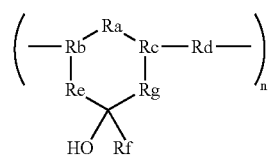

II

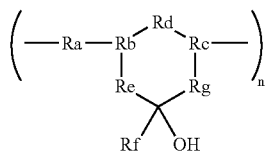

III

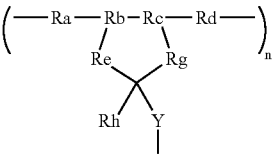

IV

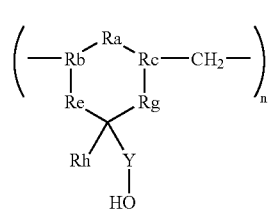

V

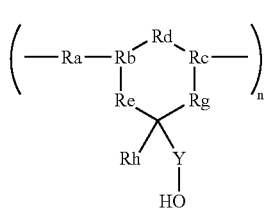

VI

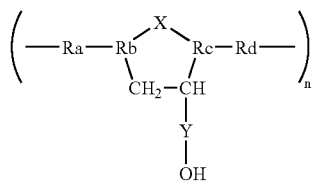

VII

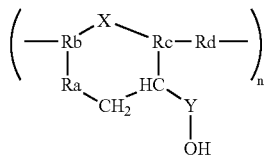

VIII

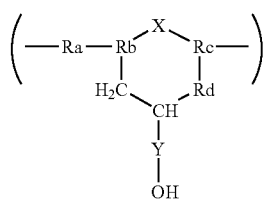

VIII where Rf is a fluoroalkyl group $(C_1-C_8)$,
Ra, Rb, Rc, Re, Rg and Rh are independently alkyl and fluoroalkyl, and Ra-Re and Rg can independently be substituted with alkyl, fluoroalkyl, spirofluoroalkyl or spiroalkyl substituent, where at least one of Ra, Rb, Rc and Rd is a fluoroalkyl group,
Y is independently alkyl or fluoroalkyl spacer group $(C_1-C_8)$, and
X is independently $CF_2$ or O.

2. The process according to claim 1, where the image-wise exposure wavelength is below 200 nm.

3. The process according to claim 1, where the aqueous alkaline solution comprises tetramethylammonium hydroxide.

4. The process according to claim 1, where the aqueous alkaline solution further comprises a surfactant.

5. The process of claim 1, where the alkyloxycarbonylalkyl group is selected from t-butyloxycarbonylmethyl, methyl-adamantyloxycarbonylmethyl, t-amyloxycarbonylmethyl, methyl-norbornyloxycarbonylmethyl, t-butyloxycarbonylpropyl and t-butyloxycarbonyldifluorobutyl.

6. The process of claim 1, where the acid labile group is selected from secondary and tertiary alkyls, acetals and ketals, trimethylsilyl, β-trimethylsilyl substituted alkyls, tetrahydrofuranyl, tetrahydropyranyl, substituted or unsubstituted methoxymethoxycarbonyl, and β-trialkylsilylalkyl.

7. The process of claim 1, where the fluoroalcohol unit is further functionalized with a compound containing nonacid labile groups and/or acid labile groups.

8. The process of claim 1, where the polymer containing an aliphatic monocyclic fluoroalcohol unit is selected from poly(1,1,2,3,3-pentafluoro-4-trifluoromethyl-4-hydroxy-1, 6-heptadiene and poly(1,1,2,3,3-pentafluoro-4-trifluoroalkyl-4-hydroxy-1,6-heptadiene).

9. The process of claim 1, where the photoresist composition further comprises a polymer with multicyclic units in the polymer backbone.

10. The process of claim 9, where the polymer with the multicyclic unit is poly(1,1,2,3,3-pentafluoro-4-trifluoromethyl-4-hydroxy-1,6-heptadiene) protected with an alkyloxycarbonylalkyl group.

11. The process of claim 1, where the photoresist composition further comprises a dissolution inhibitor.

12. The process of claim 1, where the photoresist composition further comprises a base or a photobase.

13. The process of claim 1, where the photoresist further comprises secondary polymers.

14. The process of claim 12, where the photoresist further comprises secondary polymers.

15. The process of claim 1, where the photoacid generator is selected from diazonium salts, iodonium salts, sulfonium salts, triazines, oxazoles, oxadiazoles, thiazoles, substituted 2-pyrones, phenolic sulfonic esters and mixtures thereof.

16. The process of claim 1, where the polymer containing an aliphatic monocyclic fluoroalcohol unit is selected from at least one of the structures,

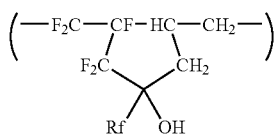

I

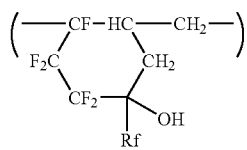

II

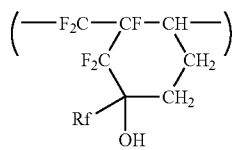

III

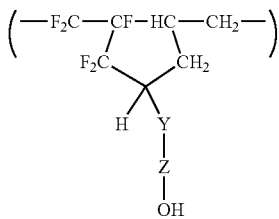

IV

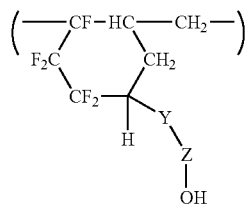

V

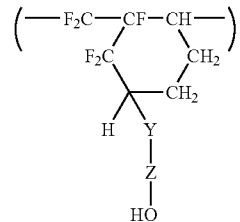

VI

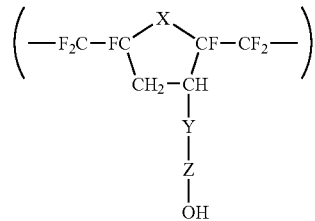

VII

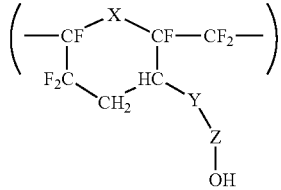

VIII where, Rf is a fluoroalkyl group ($C_1$-$C_8$),

Z is independently $CF_2$, $C(C_nF_{2n+1})_2$, $C(C_nF_{2n+1})(C_nH_{2n+1})$, n=1-12, Y is independently alkyl or fluoroalkyl spacer group ($C_1$-$C_8$), and X is independently $CF_2$ or O.

17. The process of claim 16, where the photoresist composition further comprises a base or a photobase.

18. The process of claim 17, where the photoresist composition further comprises a secondary polymer.

19. The process of claim 16, where the photoresist composition further comprises a secondary polymer.

* * * * *